United States Patent [19]

Fujii et al.

[11] Patent Number: 5,268,872
[45] Date of Patent: Dec. 7, 1993

[54] SEMICONDUCTOR INTEGRATED CIRCUIT CAPABLE OF COMPENSATING ERRORS IN MANUFACTURING PROCESS

[75] Inventors: Shinji Fujii, Yokohama; Tadahiro Kuroda, Kawasaki; Kenji Matsuo, Yokohama; Ayako Hirata, Chigasaki; Kazuhiko Kasai, Yokohama; Toshiyuki Fukunaga, Kawasaki; Masahiro Kimura, Yokohama, all of Japan

[73] Assignee: Kabushiki Kaisha Toshiba, Kawasaki, Japan

[21] Appl. No.: 766,404

[22] Filed: Sep. 27, 1991

[30] Foreign Application Priority Data

Sep. 28, 1990 [JP] Japan ................................ 2-259086
Jun. 21, 1991 [JP] Japan ................................ 3-150195

[51] Int. Cl.$^5$ ........................... G11C 7/00; H03K 5/00
[52] U.S. Cl. ........................... 365/189.07; 365/189.09; 365/208; 307/494; 307/362
[58] Field of Search ............... 365/189.07, 207, 208, 365/189.09; 307/494, 496, 362, 363

[56] References Cited

U.S. PATENT DOCUMENTS 5,189,318 2/1993 Tanaka .......................... 307/362 X Primary Examiner—Joseph A. Popek
Attorney, Agent, or Firm—Finnegan, Henderson, Farabow, Garrett & Dunner

[57] ABSTRACT

The gate of a first P-channel transistor of a first comparator is supplied with an input signal, and the gate of a second P-channel transistor of the first comparator is supplied with a reference voltage. An output terminal of the first comparator is connected to an output circuit and the gates of first and second P-channel transistors of a second comparator are supplied with the reference voltage. The second comparator outputs a voltage equal to a stand-by time output voltage of the first comparator and the output voltage from the second comparator is supplied to the non-inversion input terminal of a third comparator which is connected to a voltage generating circuit. The voltage generating circuit has substantially the same dimension ratio as the output circuit and generates a voltage equal to the threshold voltage of the output circuit. A third comparator controls the first P-channel transistors of the first and second comparators in accordance with a difference voltage between the output voltage of the second comparator and the output voltage of the voltage generating circuit to thereby automatically set a stand-by time output voltage of the first comparator at a value close to the threshold of the output circuit.

24 Claims, 22 Drawing Sheets

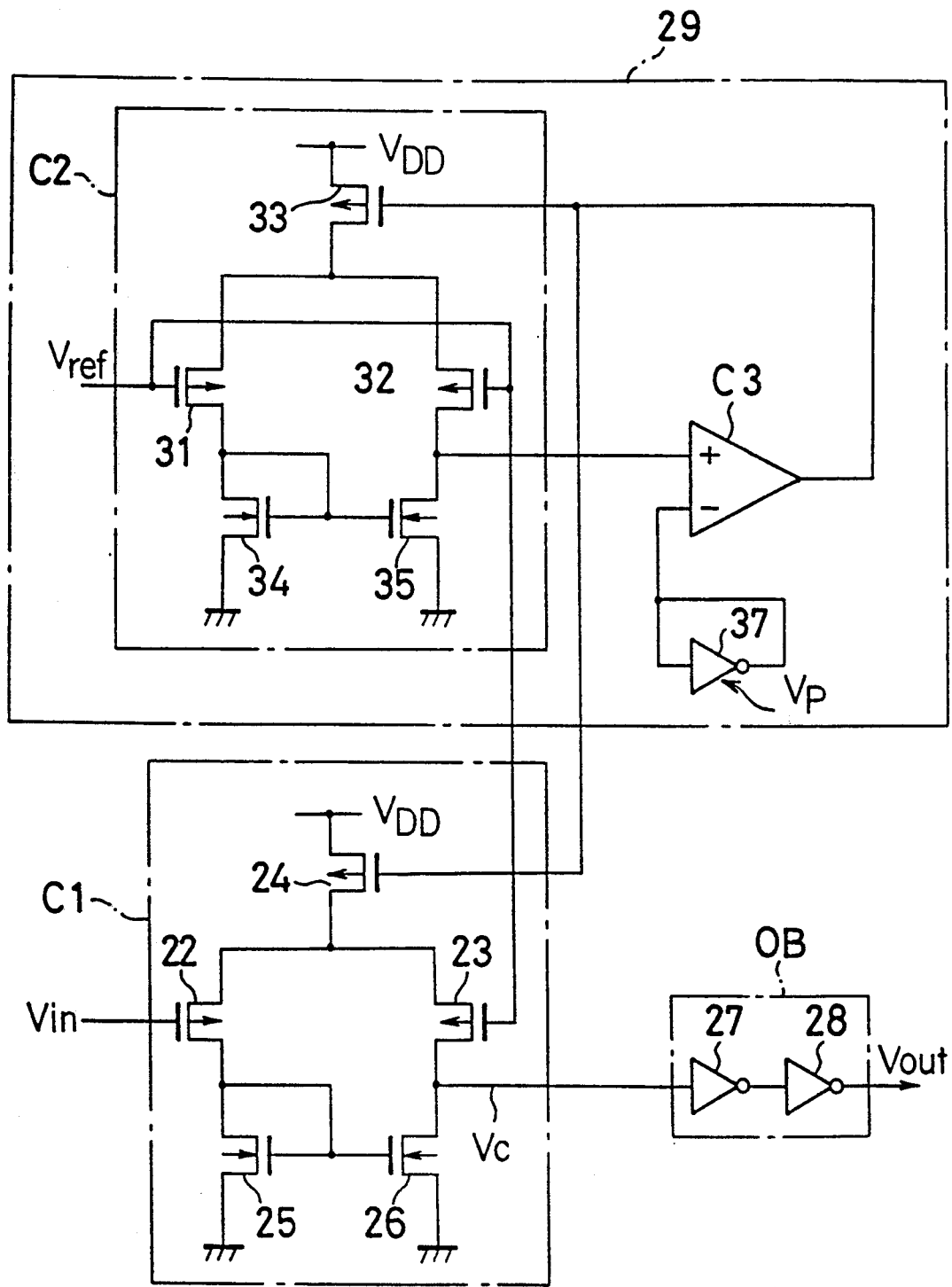
F I G. 1

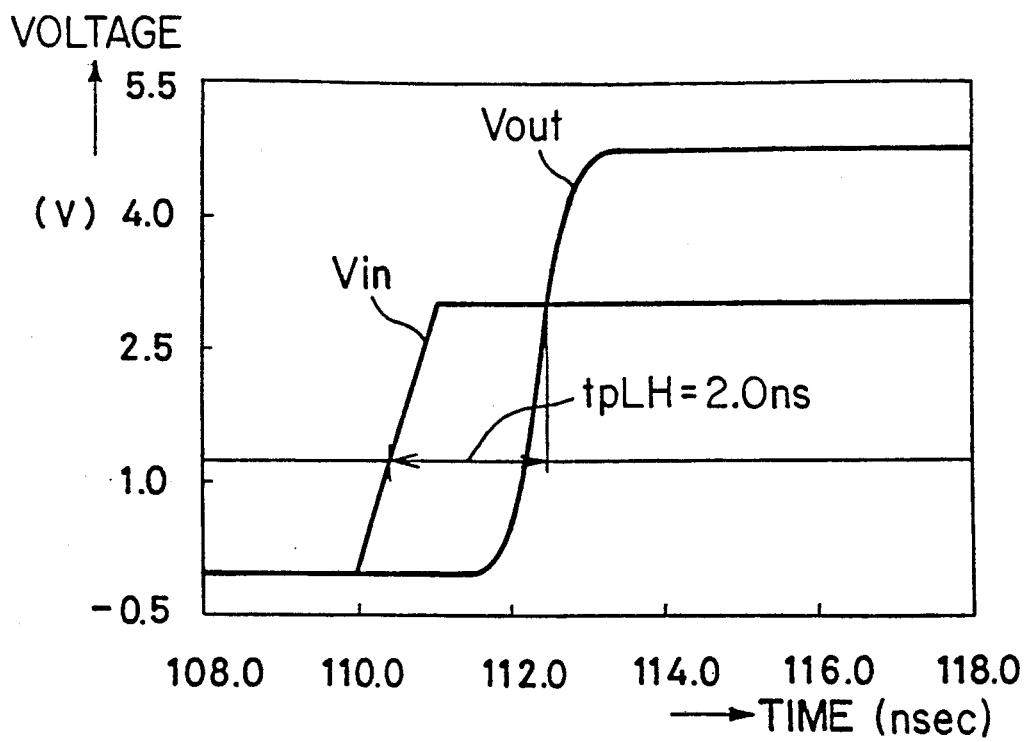
F I G. 4
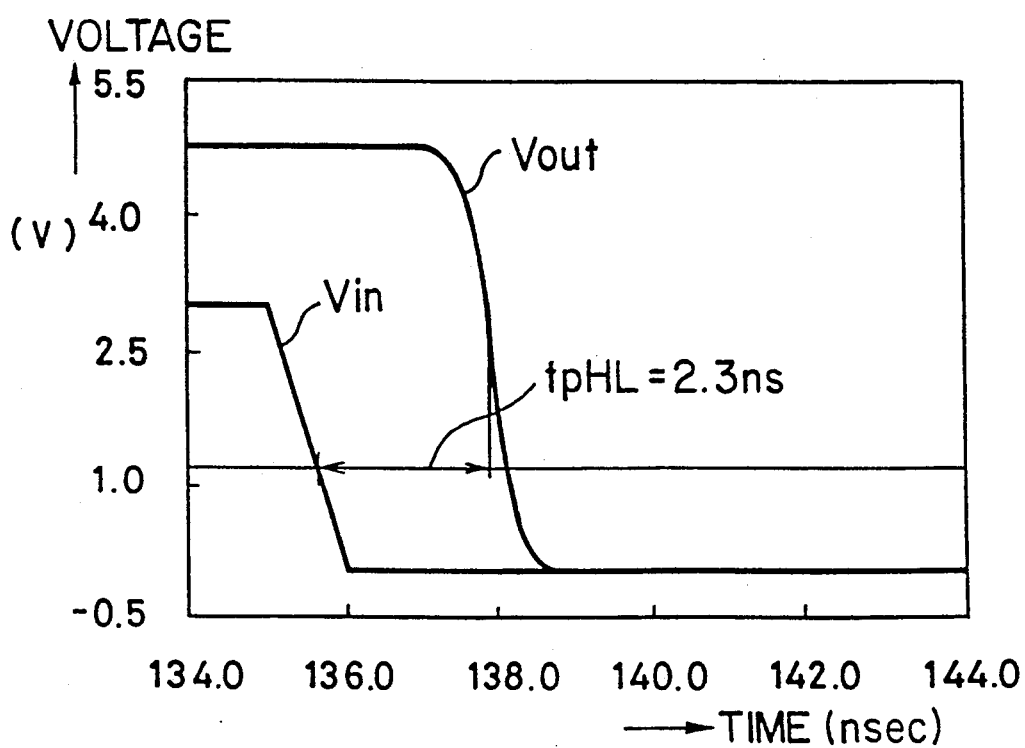
F I G. 5

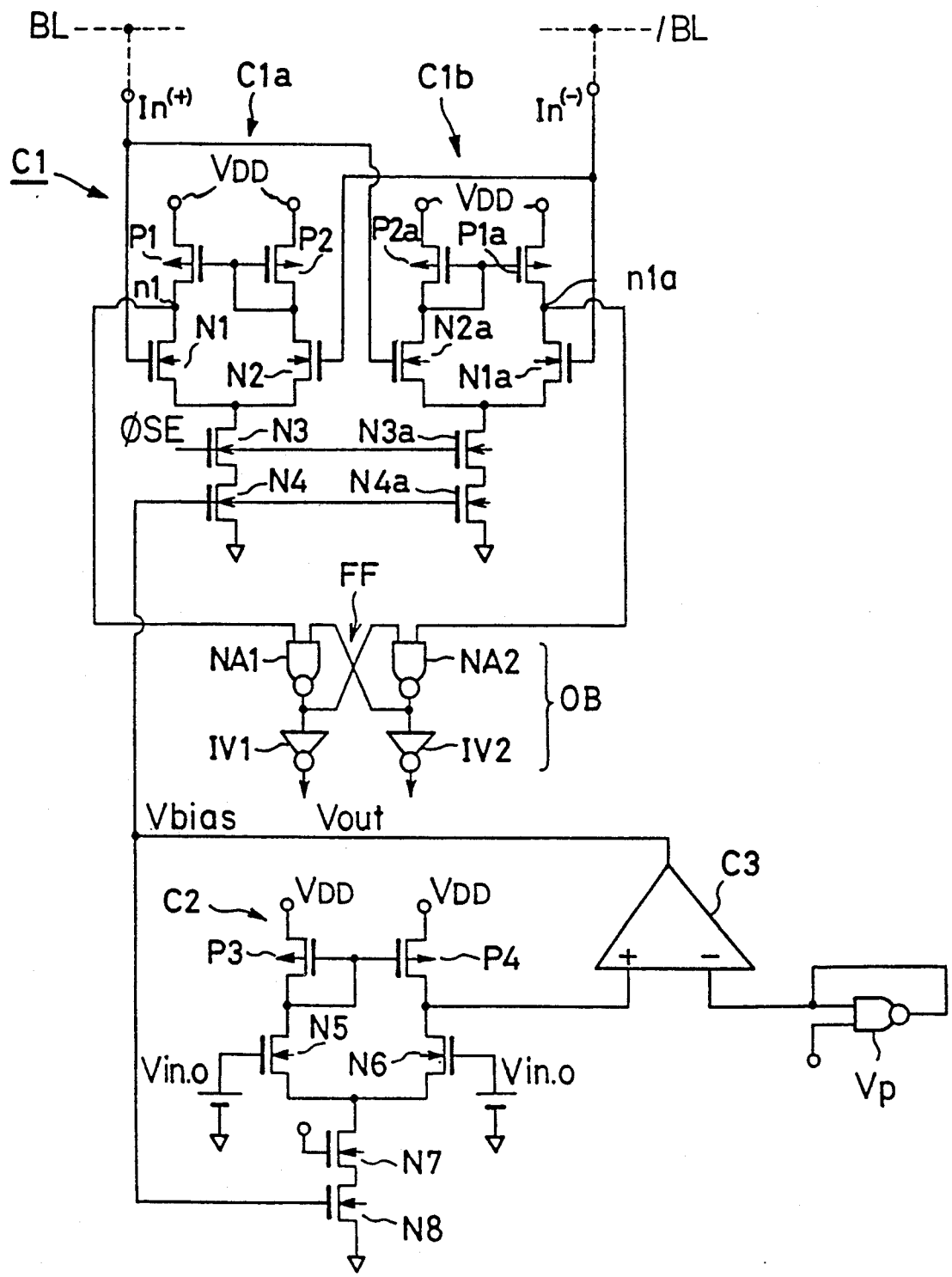
F I G. 11

| PROCESS CONDITION | CIRCUIT (A) OF THE PRESENT INVENTION | | CONVENTIONAL CIRCUIT (B) | |
|---|---|---|---|---|
| Vth.p / Vth.N | Vsense.0 - Vth.c | tpd | Vsense-Vth | tpd |
| 0.85$^V$ / 0.85$^V$ | 0.18$^V$ | 2.22 nsec | 0.20$^V$ | 2.50 nsec |
| 0.6$^V$ / 0.6$^V$ | 0.17$^V$ | 1.65 nsec | 0.16$^V$ | 1.87 nsec |
| 1.1$^V$ / 1.1$^V$ | 0.14$^V$ | 2.44 nsec | 0.16$^V$ | 1.95 nsec |
| 0.6$^V$ / 1.1$^V$ | 0.14$^V$ | 1.73 nsec | 0.06$^V$ | 1.50 nsec |
| 1.1$^V$ / 0.6$^V$ | 0.16$^V$ | 2.34 nsec | 0.27$^V$ | 3.47 nsec |

FIG. 12

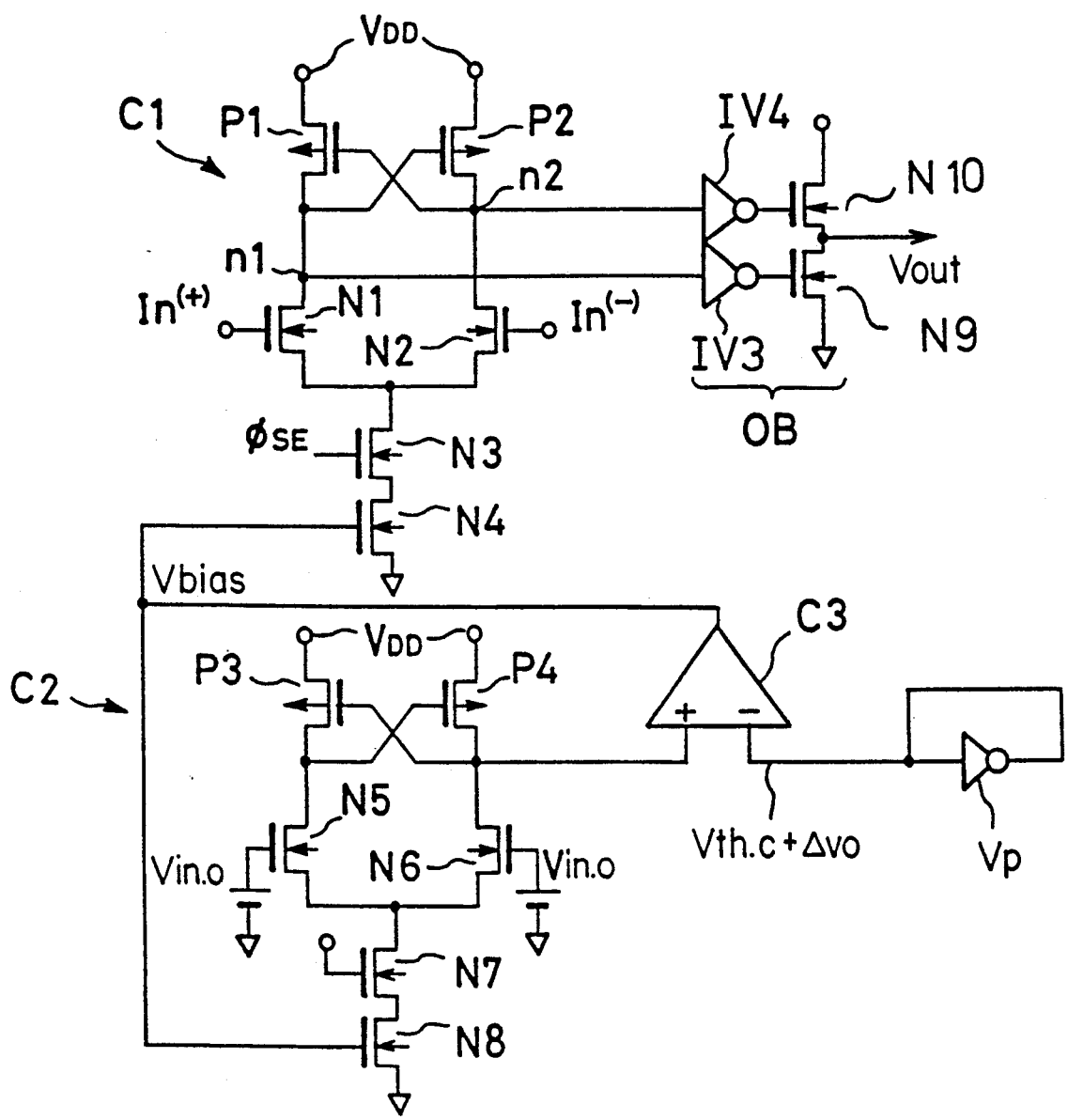
F I G. 13

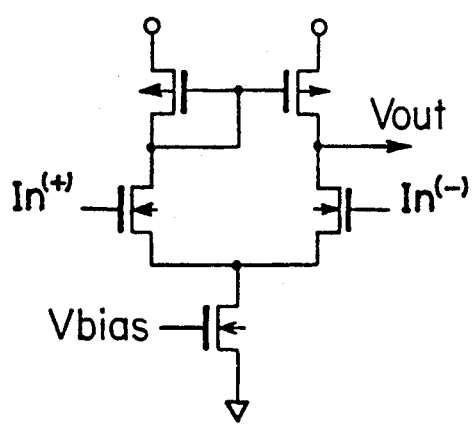
F I G. 14A
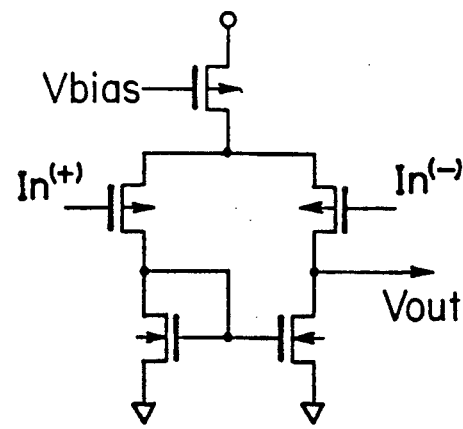
F I G. 14B
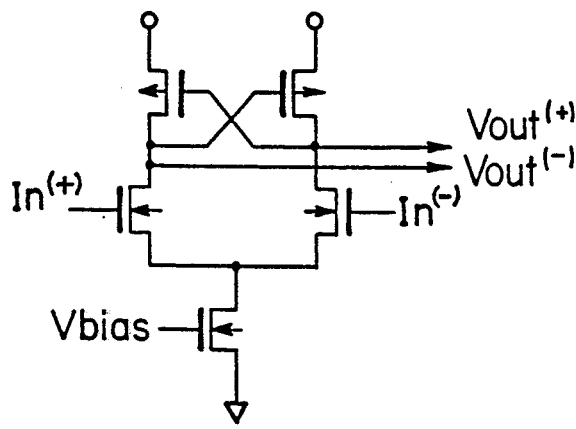
F I G. 14C
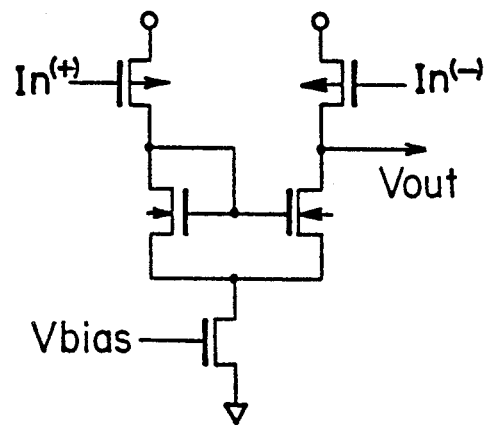
F I G. 14D
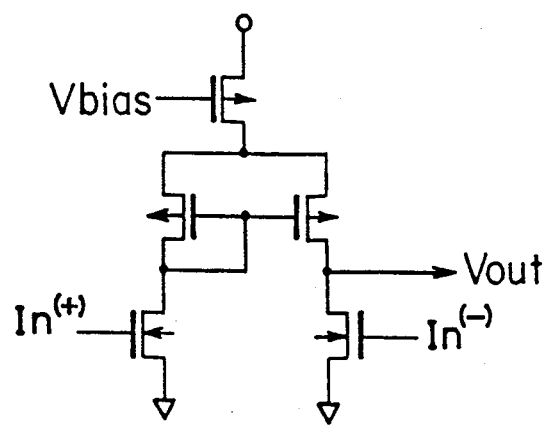
F I G. 14E

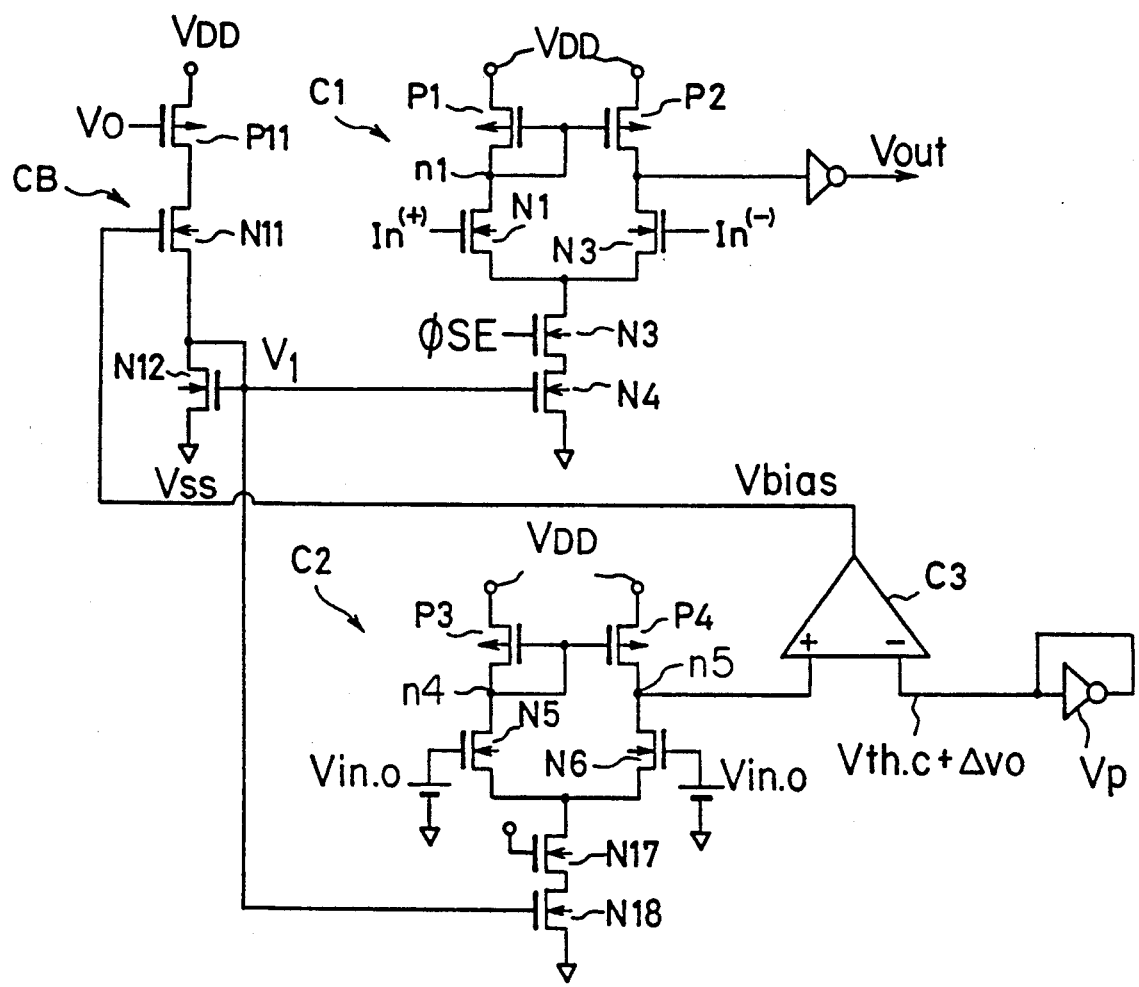
F I G. 15

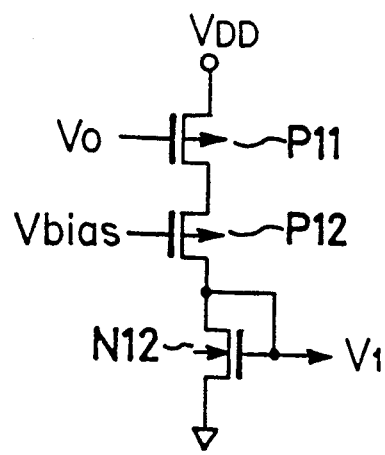
F I G. 16A
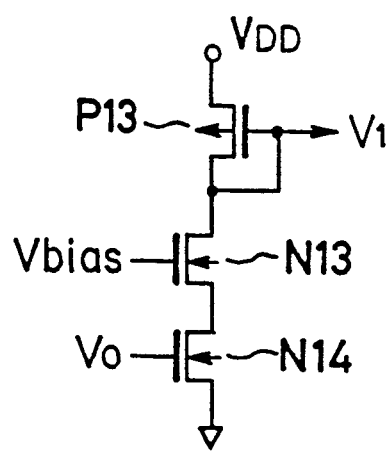
F I G. 16B
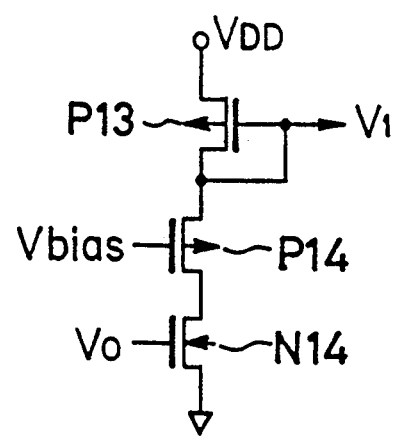
F I G. 16C

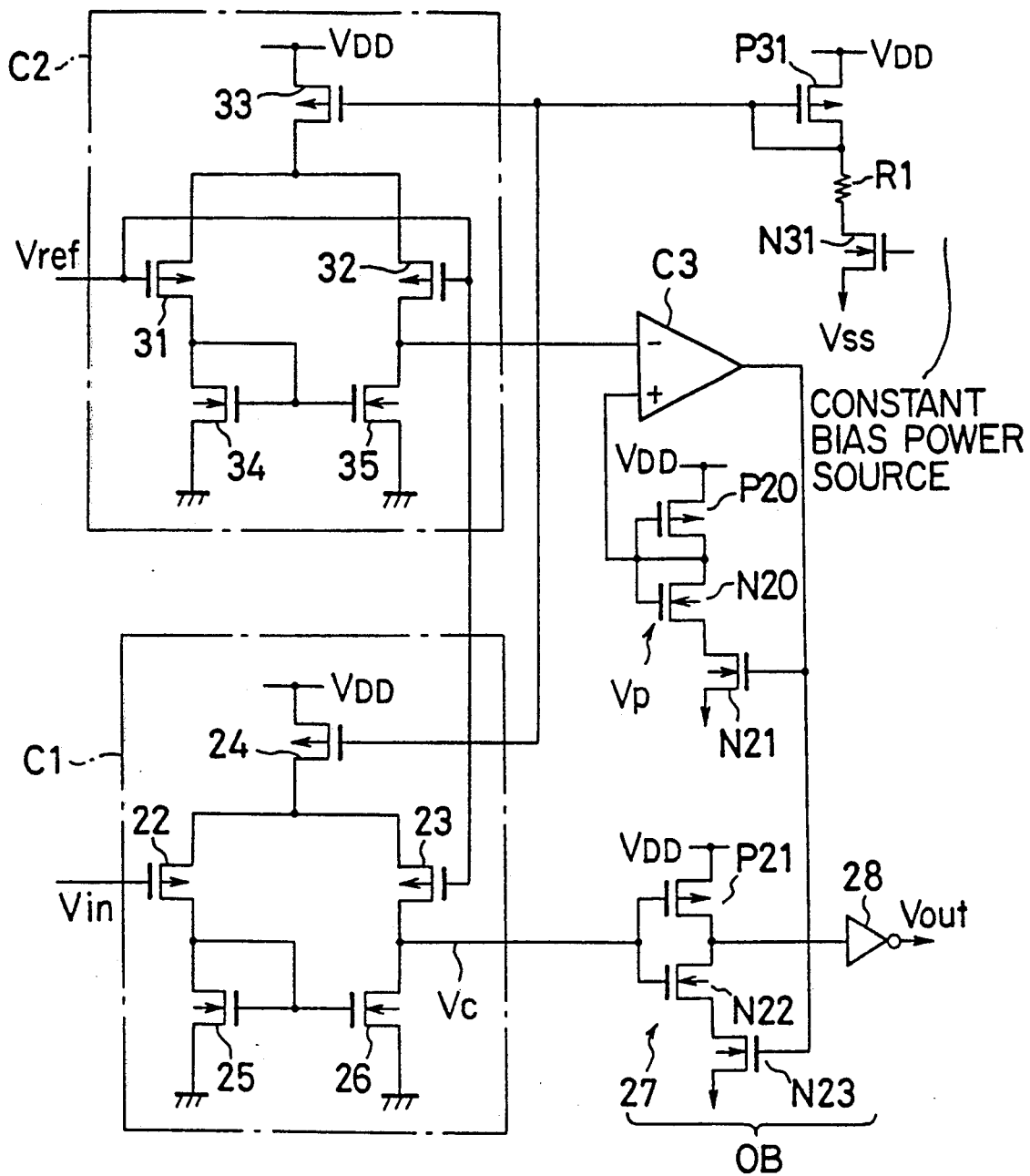
F I G. 18

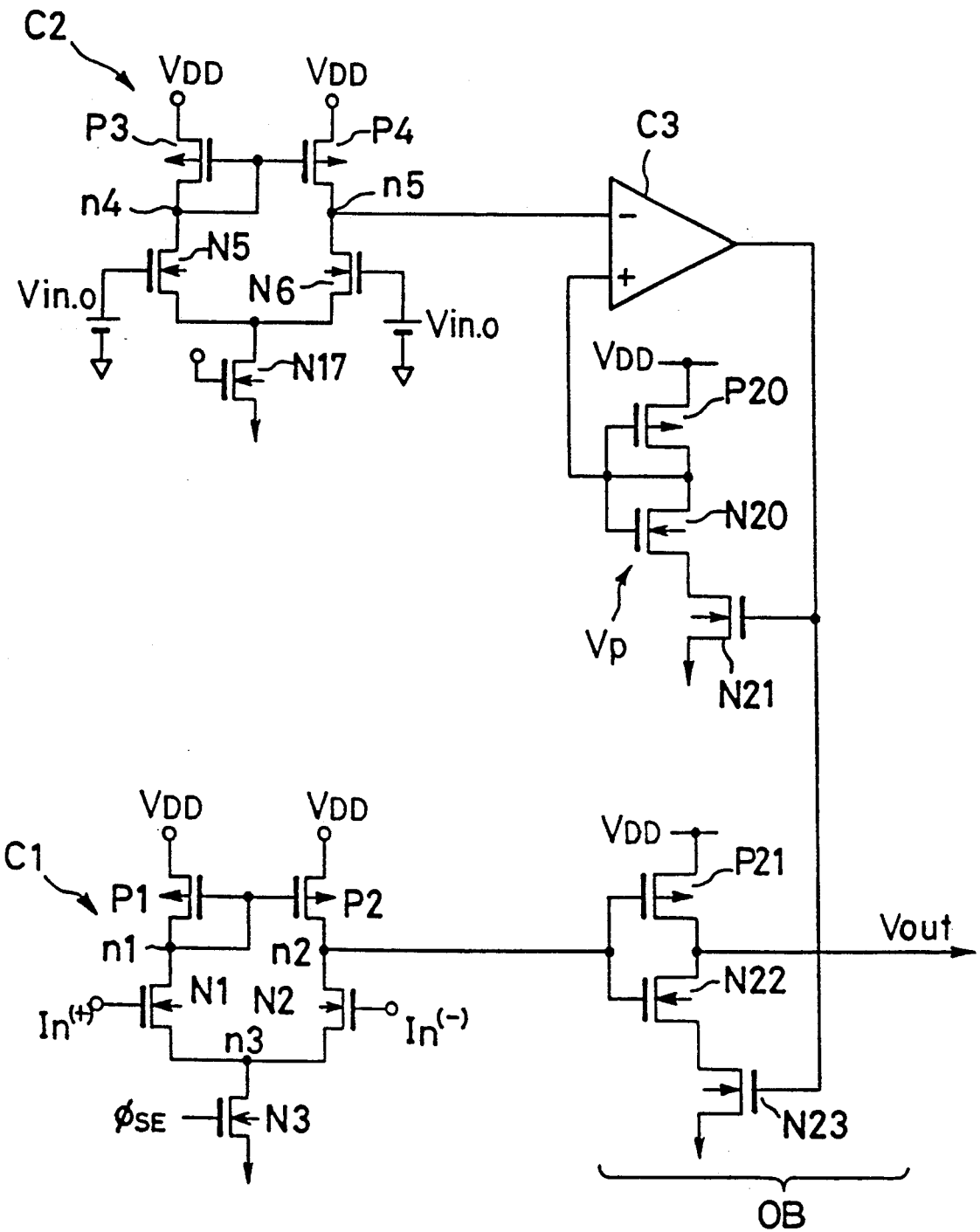
F I G. 19

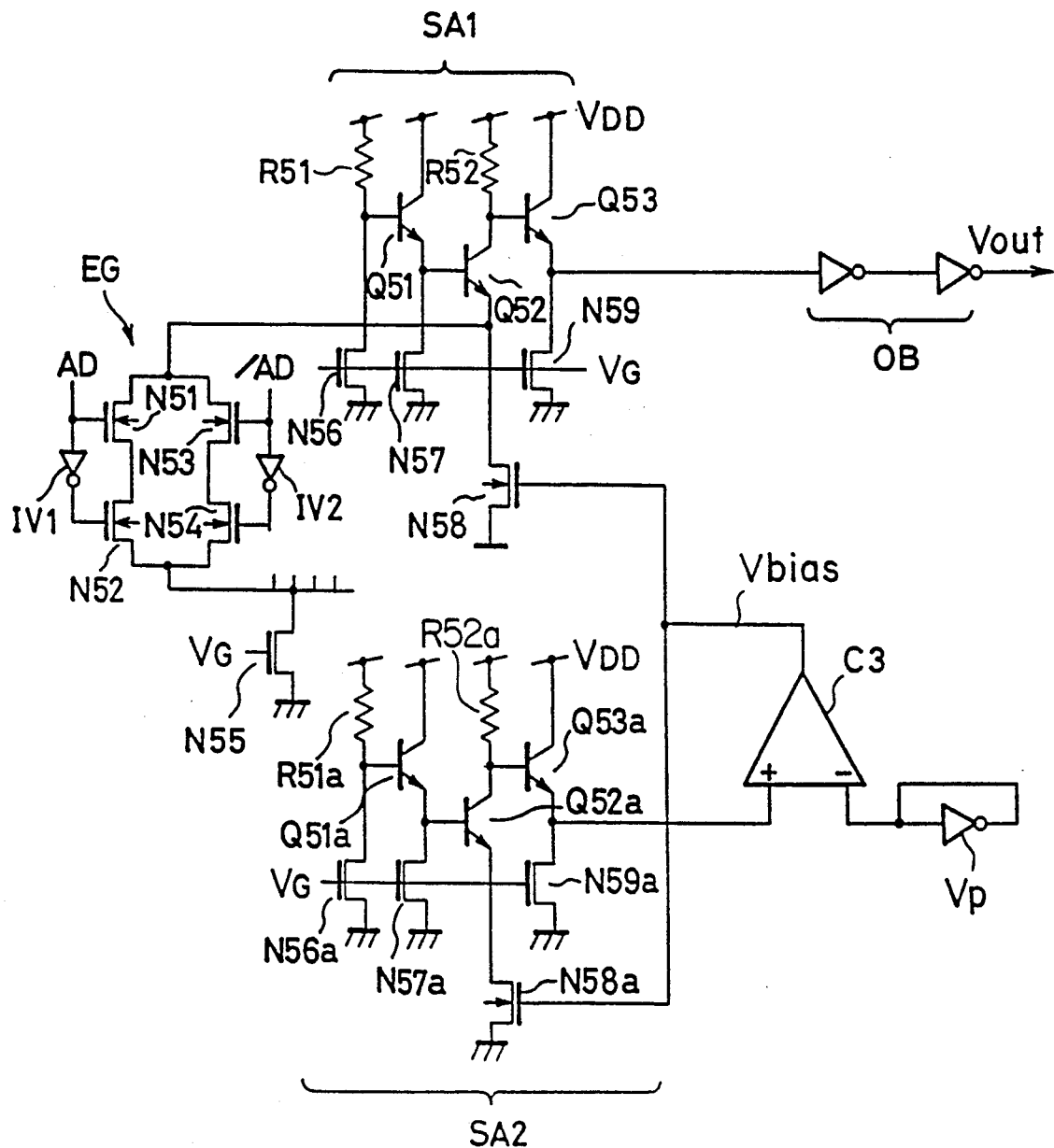
F I G. 20

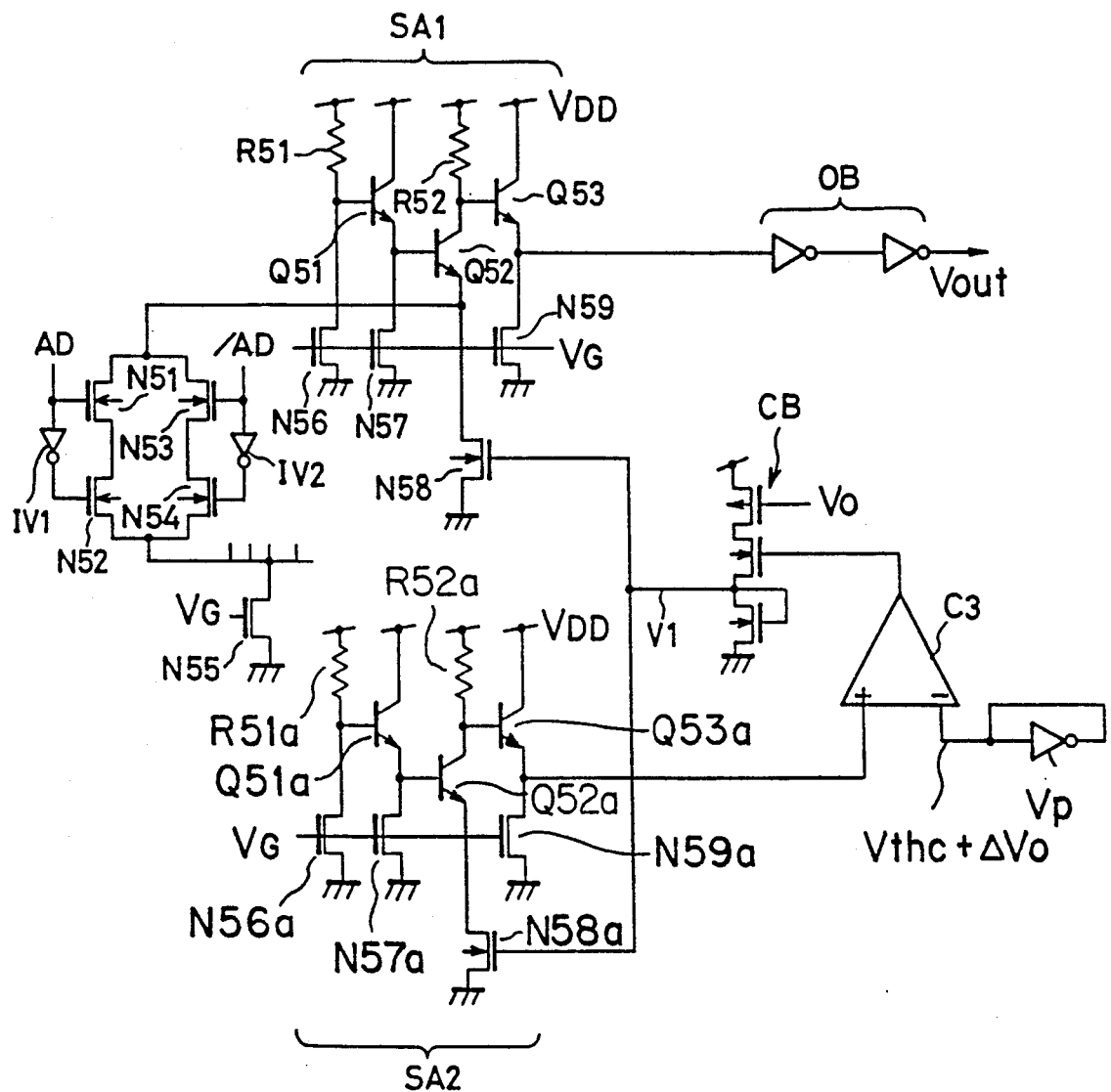
F I G. 21

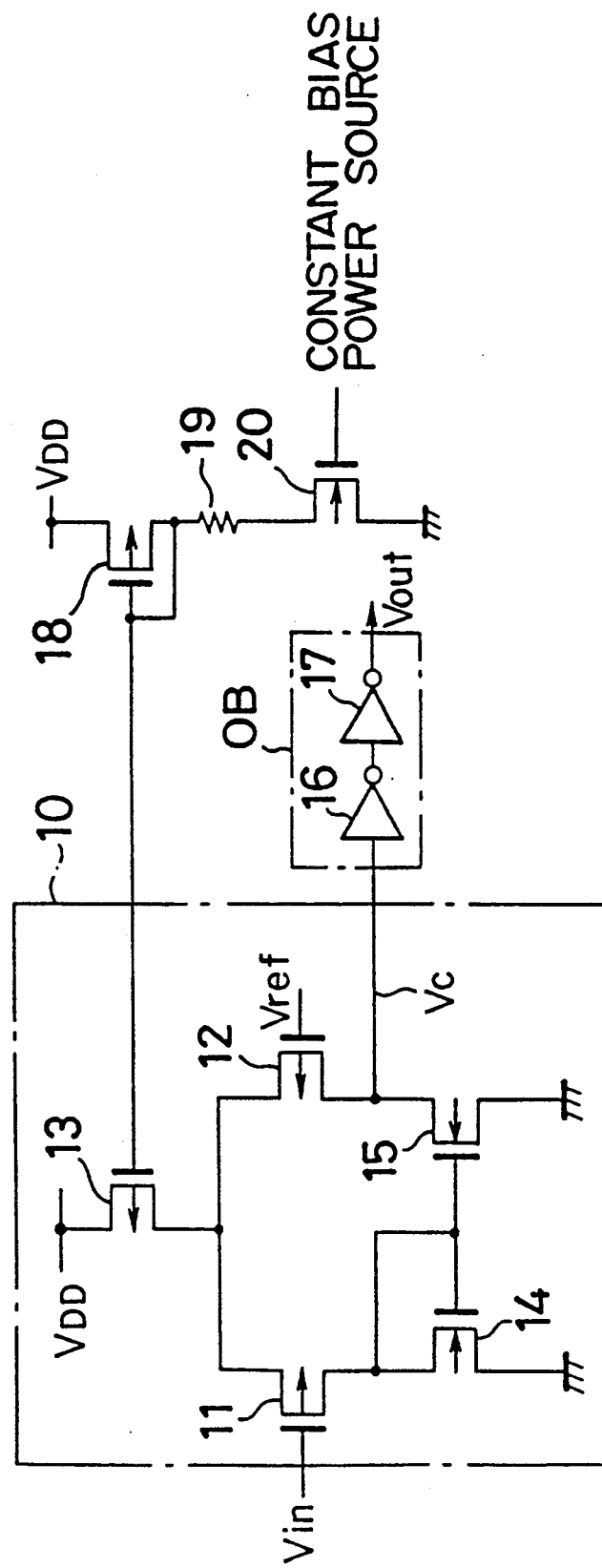
F I G. 24

SEMICONDUCTOR INTEGRATED CIRCUIT CAPABLE OF COMPENSATING ERRORS IN MANUFACTURING PROCESS

BACKGROUND OF THE INVENTION

1. Field of the Invention

The present invention relates to a sense amplifier used, for example, in a signal input circuit or a memory read-out circuit, and to a semiconductor integrated circuit applied, for example, to an address transition detector for detecting a change of a memory address signal.

2. Description of the Related Art

FIG. 24 shows a conventional input circuit. The input circuit comprises a comparator 10 and an output circuit OB constituted by CMOS inverter circuits. (hereinafter, called "CMOS output circuit").

The comparator 10 is constituted by a differential amplifier. Specifically, an input voltage Vin is supplied to the gate of a P-channel transistor 11 which is an element of the comparator 10. A reference voltage Vref is supplied to the gate of a P-channel transistor 12. The sources of the transistors 11 and 12 are connected to a power source $V_{DD}$ via a P-channel transistor 13 which constitutes a current source. The drains of the transistors 11 and 12 are connected to the drains of N-channel transistors 14 and 15. The gates of the N-channel transistors 14 and 15 are commonly connected to the drain of the N-channel transistor 14. The sources of the transistors 14 and 15 are grounded. The connection node between the drain of the N-channel transistor 15 and the drain of the P-channel transistor 12 is connected in series to inverter circuits 16 and 17 which constitute the output circuit OB.

On the other hand, the gate of the P-channel transistor 13, which constitutes the current source, is connected to the gate of a P-channel transistor 18. The source of the P-channel transistor 18 is connected to a power source $V_{DD}$, and the drain of the transistor 18 is connected to the gate of the transistor 18. The drain of the transistor 18 is also connected to the drain of an N-channel transistor 20 via a resistor 19. The source of the transistor 20 is grounded, and the gate thereof is connected to a constant bias source (not shown).

With the above structure, if a voltage equal to a threshold value of the input circuit is supplied as reference voltage Vref, the operation with the accurate threshold value can be performed.

Regarding the input circuit with the above structure, if threshold values VthP and VthN of the P-channel transistors and N-channel transistors are varied owing to a variance in the semiconductor manufacturing process, a response time tpLH in the case where the input voltage Vin changes from a high level to a low level is varied. In addition, a response time tpHL in the case where the input voltage Vin changes from the low level to the high level is varied, and the difference therebetween, $\Delta tp = |tpLH - tpHL|$, increases.

FIGS. 25A to 25C are views for explaining the operation of the input circuit shown in FIG. 24. As is shown in FIG. 25A, when the input voltage Vin changes from the high level to the low level or from the low level to the high level, the output voltage Vc of the comparator 10 varies, as shown in FIG. 25B. When the threshold value Vthc of the inverter circuit 16, which constitutes the output circuit, becomes higher than an operation point A of the comparator 10 owing to a variance in the manufacturing process, the output voltage Vout of the inverter circuit 17 varies, as shown in FIG. 25C. In other words, the response times tpHL and tpLH increase, and also the difference Atp therebetween increases.

FIGS. 26 and 27 show results of simulation of the input circuit shown in FIG. 25, which results were obtained by use of a well-known SPICE (a circuit simulator developed by University of California). Specifically, output signals in relation to input voltages are shown. The conditions for the simulation are: the channel length of each transistor is longer than a standard length, e.g. by 0.2 μm; the threshold value VthP of the P-channel transistor is lower than a standard length, e.g. by 0.25 V; and the threshold value VthN of the N-channel transistor is higher than a standard length, e.g. by 0.25 V. The voltage of the power source $V_{DD}$ is 4.75 V.

As is shown in FIG. 26, the response time tpLH of the output signal Vo in relation to the rising of the input voltage Vin is 3.8 ns, and, as shown in FIG. 27, the response time tpLH of the output signal Vo in relation to the falling of the input voltage Vin is 1.8 ns. The difference between the response times is $|tpLH - tpHL| = 2.6\ ns$ On possible means for decreasing the response times tpHL and tpLH is to make steeper the inclination of the output voltage of the comparator 10, which is shown in FIG. 25B. In this case, however, it is necessary to make the current value of the current source excessively higher, and this is practically impossible.

SUMMARY OF THE INVENTION

The object of the present invention is to provide a semiconductor integrated circuit capable of compensating variances in the manufacturing process, power source voltages and ambient temperatures, and carrying out a maximum-speed operation.

This object can be achieved by a semiconductor integrated circuit comprising:

a comparator having a first input terminal, a second input terminal and a current source circuit, said comparator outputting a difference voltage between a first input voltage supplied to the first input terminal and a second input voltage supplied to the second input terminal;

an output circuit to which the output voltage from the comparator is supplied, said output circuit being constituted by a circuit element having a threshold voltage;

a voltage generating circuit for generating a voltage equal to the threshold voltage of the output circuit, a circuit element constituting the voltage generating circuit having substantially the same dimension ratio as the circuit element of the output circuit; and a correction circuit for controlling a current amount of the current source circuit in accordance with the voltage generated by the voltage generating circuit, and correcting the output voltage from the comparator so that the output voltage from the comparator is substantially equal to the threshold voltage of the output voltage when the first input voltage supplied to the first input terminal is equal to the second input voltage supplied to the second input terminal.

Further, this object can be achieved by a semiconductor integrated circuit comprising:

a first comparator having a first input terminal, a second input terminal and a first current source circuit, said first comparator outputting a difference voltage between complementary voltages with opposite potentials supplied to the first and second input terminals;

an output circuit to which the output voltage from the first comparator is supplied, said output circuit being constituted by a circuit element having a threshold voltage;

a second comparator having a third input terminal, a fourth input terminal and a second current source circuit, said third and fourth input terminals being supplied with voltages equal to the output voltage from the first comparator at the stand-by state, and said second comparator outputting difference voltages between these voltages;

a voltage generating circuit for generating a voltage equal to the value obtained by adding a design margin to the threshold voltage of the output circuit, a circuit element constituting the voltage generating circuit having substantially the same dimension ratio as the circuit element of the output circuit; and a third comparator, having a fifth input terminal and a sixth input terminal, for controlling the amounts of currents to the first and second current source circuits in accordance with the difference voltage between the voltage supplied to the fifth input terminal from the voltage generating circuit and the voltage supplied to the sixth input terminal from the second comparator.

According to the present invention, the correction circuit controls the output voltage of the comparator so as to be equal to the threshold voltage of the output circuit when the input voltage of the comparator becomes equal to the reference voltage. Thus, when this invention is applied to an input circuit constituted by a comparator and an output circuit, it is possible to reduce the variances in the response time tpLH of the output signal in relation to the rising of the input voltage and the response time tpHL of the output signal in relation to the falling of the input voltage, even if a variance occurs in the manufacturing process.

In addition, in the present invention, complementary signals are supplied to two input terminals of the first comparator. Potentials corresponding to the stand-by time input signal of the first comparator are supplied to two input terminals of the second comparator. An output potential of the second comparator and a potential obtained by adding a design margin to the threshold of the output circuit are supplied to two input terminals of the third comparator, and an output potential of the third comparator is supplied to bias current control input terminals of the first and second comparators. Thus, by constituting a negative feedback loop by means of the second comparator and the third comparator, the stand-by time output potential of the first comparator can automatically be controlled to be close to the threshold of the output circuit. Accordingly, when this invention is applied to an input circuit, a sense amplifier, an address transition detector, etc., it is possible to compensate variances in the manufacturing process, power source voltages and ambient temperatures, and to always carry out a maximum-speed operation of these circuits.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a circuit diagram showing a first embodiment of the present invention, wherein this invention is applied to an input circuit;

FIG. 4 is a characteristic diagram showing the simulation result of the circuit of FIG. 1;

FIG. 5 is a characteristic diagram showing the simulation result of the circuit of FIG. 1;

FIG. 11 is a circuit diagram showing a fourth embodiment of the invention, wherein the circuit of FIG. 6 is modified;

FIG. 12 shows simulation results of the characteristics of the circuit of the present invention and the conventional circuit, which were obtained by use of the SPICE;

FIG. 13 is a circuit diagram showing a fifth embodiment of the invention, wherein the circuit of FIG. 6 is modified;

FIGS. 14A to 14E are circuit diagrams showing examples of first and second comparators;

FIG. 15 is a circuit diagram showing a sixth embodiment of the invention, wherein the circuit of FIG. 6 is modified;

FIGS. 16A to 16C show another example of the current bias circuit CB shown in FIG. 15;

FIG. 18 is a circuit diagram showing an eighth embodiment of the invention;

FIG. 19 is a circuit diagram showing a ninth embodiment of the invention;

FIG. 20 is a circuit diagram showing a tenth embodiment of the invention, wherein this invention is applied to an address transition detector;

FIG. 21 is a circuit diagram showing an eleventh embodiment of the invention, wherein the circuit of FIG. 20 is modified;

FIG. 24 shows an example of a conventional input circuit;

DETAILED DESCRIPTION OF THE PREFERRED EMBODIMENTS

Figure 2:
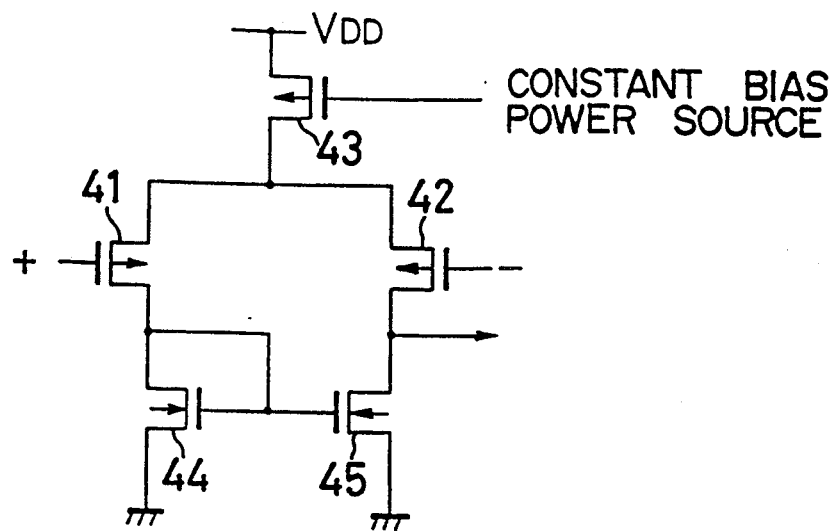
FIG. 2 is a circuit diagram showing a part of the circuit of FIG. 1.

Embodiments of the present invention will now be described with reference to the accompanying drawings.

FIG. 1 shows an embodiment of the invention wherein this invention is applied to an input circuit. In FIG. 1, an input voltage Vin is supplied to a P-channel transistor 22, which is a structural element of a first comparator C1. A reference voltage Vref is supplied from a second comparator C2 (described later) to the gate of a P-channel transistor 23. The sources of the P-channel transistors 22 and 23 are connected to a power source $V_{DD}$ via a P-channel transistor 24 which constitutes a current source. The drains of the P-channel transistors 22 and 23 are connected to the drains of N-channel transistors 25 and 26. The gates of the transistors 25 and 26 are commonly connected to the drain of the N-channel transistor 25, and the sources thereof are grounded. The connection node between the drain of the N-channel transistor 26 and the drain of the P-channel transistor 23 is connected in series to CMOS inverter circuits 27 and 28 which constitute a CMOS output circuit OB.

Figure 8:
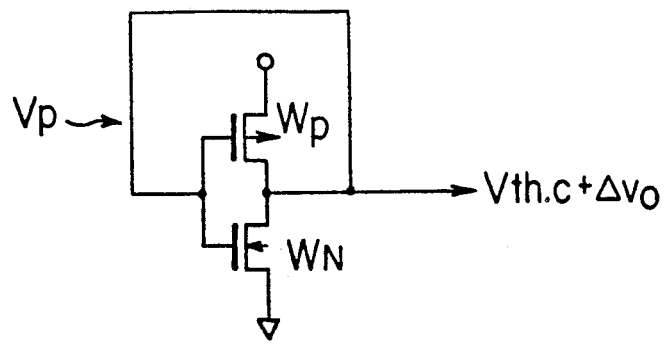
FIG. 8 shows an example of a reference potential generating circuit shown in FIG. 6.

On the other hand, a correction circuit 29 includes the above-mentioned second comparator C2. A reference voltage Vref is supplied to the gates of P-channel transistors 31 and 32 which constitute the second comparator C2. The sources of the P-channel transistors 31 and 32 are connected to a power source $V_{DD}$ via a P-channel transistor 33 which constitutes a current source, and the drains of the transistors 31 and 32 are connected to the drains of N-channel transistors 34 and 35. The gates of the N-channel transistors 34 and 35 are commonly connected to the drain of the N-channel transistor 34, and the sources of the transistors 34 and 35 are grounded. The connection node between the drain of the N-channel transistor 35 and the drain of the P-channel transistor 32 is connected to a non-inversion input terminal of a third comparator C3. The inversion input terminal of the third comparator C3 is connected to input and output terminals of a CMOS inverter circuit 37. The inverter circuit 37 constitutes a reference potential generating circuit Vp, and has the same structure as is shown in FIG. 8. The output terminal of the third comparator C is connected to the gates of the P-channel transistors 24 and 33 which constitute current sources. The inverter circuit 37 has substantially the same dimension ratio as the inverter circuit 27. In other words, the transistors (not shown), which constitute the inverter circuits 37 and 27, have substantially the equal ratio of channel width to channel length.

FIG. 2 shows the third comparator C3. The gate of a P-channel transistor 41 functions as a non-inversion input terminal, and the gate of a P-channel transistor 42 functions as an inversion input terminal. A P-channel transistor 43 is provided between the sources of the P-channel transistors 41 and 42 and a power source $V_{DD}$. The gate of the transistor 43 is connected to a constant bias power source. Regarding N-channel transistors 44 and 45, the connection node between the drain of the N-channel transistor 45 and the drain of the P-channel transistor 42 functions as an output terminal.

Figure 3A:
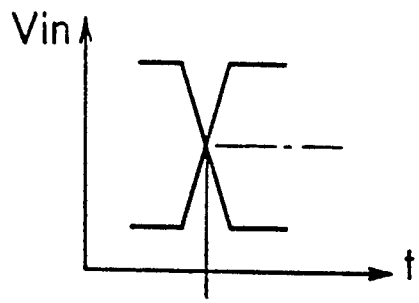
FIGS. 3A to 3C are characteristic diagrams for explaining the operation of the circuit of FIG. 1.
Figure 3B:
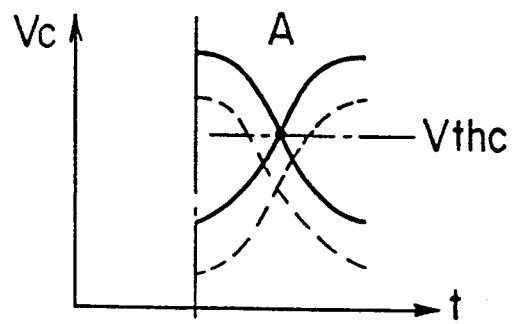

The operation of the above circuit will now be described with reference to FIG. 3. The inverter circuit 37 and the inverter circuit 27 have substantially the same dimension ratio. A voltage, which is equal to a threshold level of the inverter circuit 27, is supplied by the inverter circuit 37 to the inversion input terminal of the third comparator C3. An output voltage of the third comparator C3 is supplied to the gates of the P-channel transistors 24 and 33 which constitute current sources for the first and second comparators C1 and C2. Thus, both input terminals of the third comparator C3 are controlled to have the same potential, and the comparator C3 is set in an "imaginary short-circuit" state. When an equal potential is supplied to the gates of the transistors 24 and 33 and the input voltage Vin is equalized to the reference voltage Vref, the operation point of the first comparator C1 is equal to the threshold of the inverter circuit 27.

Figure 3C:
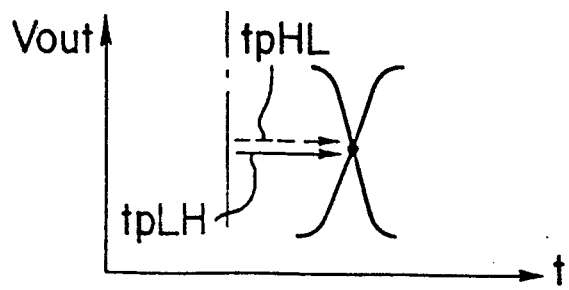

In the case where the channel length of the transistor, which constitutes the inverter circuit 27, is increased owing to the variance in the manufacturing process, the threshold Vthc of this circuit rises. In this case, the channel length of the transistor, which has the same dimension ratio and constitutes the inverter circuit 37, is also increased, and the threshold Vthc of this circuit also rises. Accordingly, the output voltage of the third comparator C3 is lower than in the case where the transistors of the inverter circuit 27, etc. have standard lengths, and the current amount of the transistors 24 and 33 of the first and second comparators C1 and C2 increase. As a result, the operation point of the first comparator C1 rises. In other words, compared to the case wherein no variance occurs in the manufacturing process, as denoted by broken lines in FIG. 3B, the operation point A rises and the output voltage Vc of the first comparator C1 becomes equal to the threshold Vthc of the inverter circuit 27. Thus, as shown in FIG. 3C, the response time tpLH in the case where the input voltage Vin changes from the high level to the low level can be made substantially equal to the response time tpHL in the case where the input voltage Vin changes from the low level to the high level.

Figure 26:
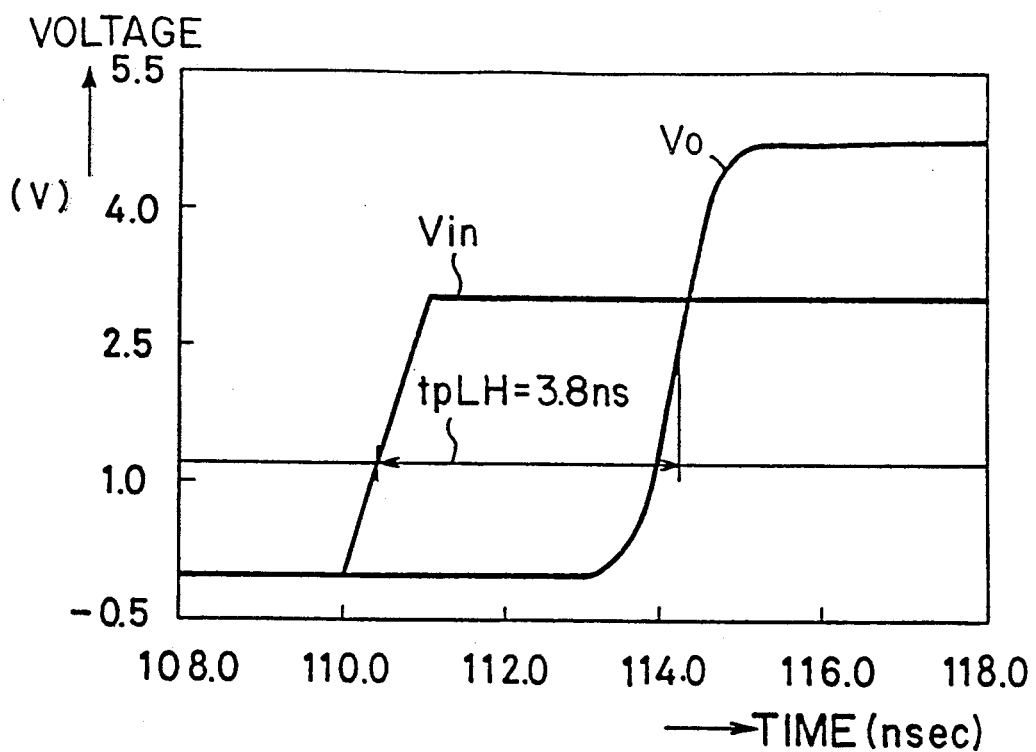
FIG. 26 shows simulation results of the circuit of FIG. 24.
Figure 27:
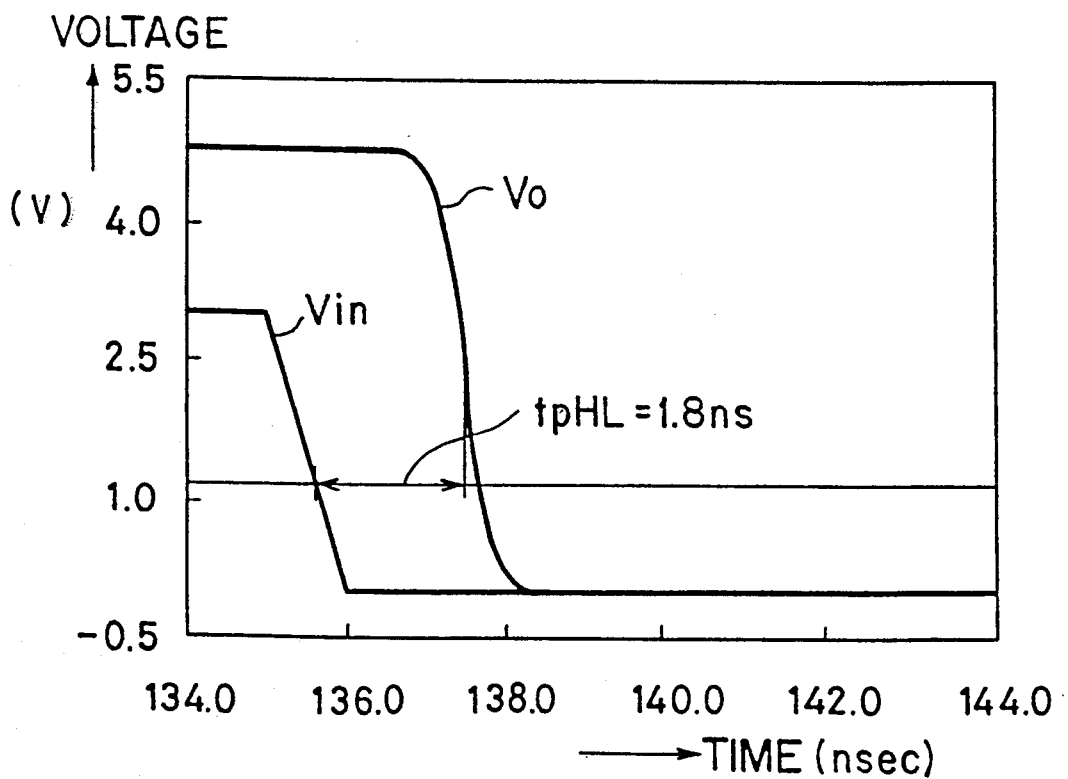
FIG. 27 shows simulation results of the circuit of FIG. 24.

FIGS. 4 and 5 show the results of simulation of the circuit shown in FIG. 1. The simulation was carried out by means of a well-known simulator SPICE. Specifically, the output signals in relation to the input voltages are shown. The conditions for the simulation are the same as in the cases shown in FIGS. 26 and 27.

As is shown in FIG. 4, a response time tpH of the output voltage Vout in relation to the rising of the input voltage Vin is 2.0 ns. As is shown in FIG. 5, a response time tpHL of the output voltage Vout in relation to the falling of the input voltage Vin is 2.3 ns. The difference between these response times is $tpLH - tpHL = 0.3$ ns Thus, the difference can be made much less than that in the prior art. In addition, the time tpHL is 2.3 ns, which is shorter by 1.5 ns than in the prior art.

A second embodiment of the present invention will now be described with reference to FIG. 6.

Figure 6:
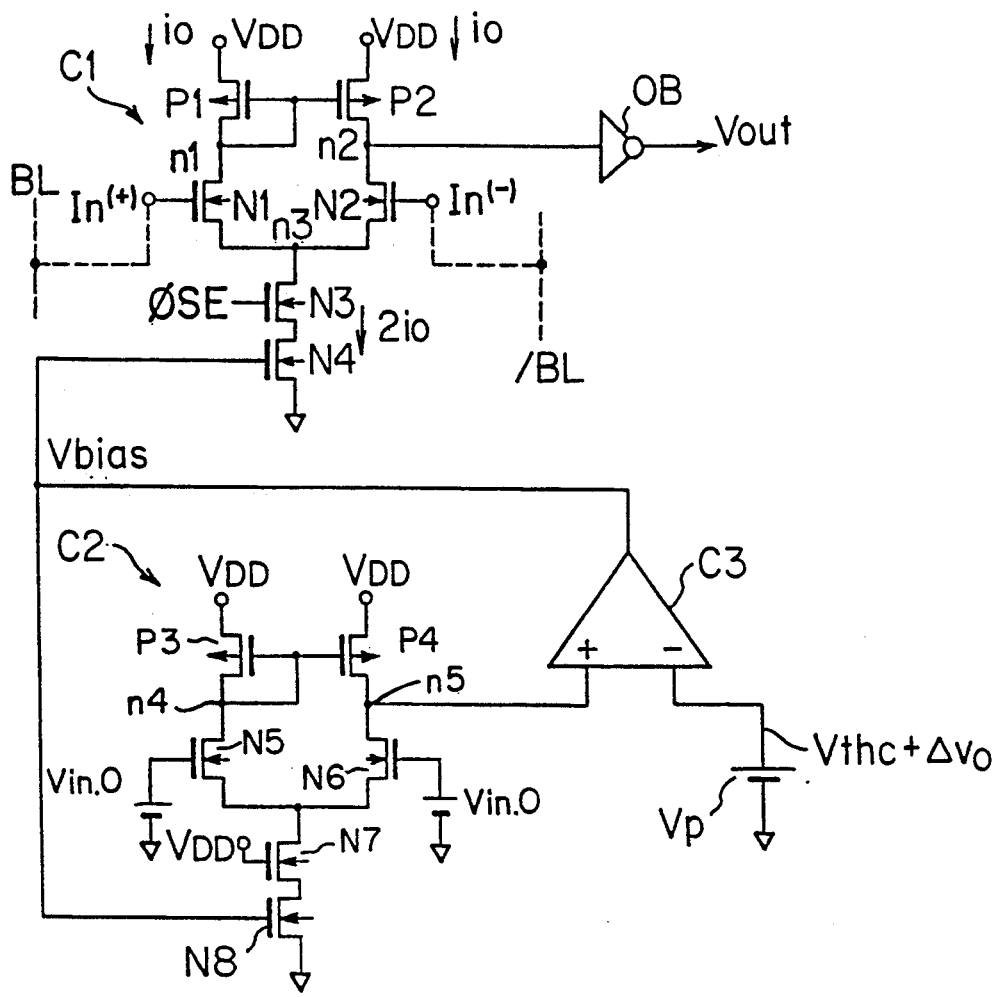
FIG. 6 is a circuit diagram showing a second embodiment of the invention, wherein this invention is applied to a current-mirror type sense amplifier.

FIG. 6 shows a current mirror type sense amplifier to which the present invention has been applied. This sense amplifier is constituted mainly by first to third comparators C1, C2 and C3.

In the first comparator C1, the sources of the P-channel transistors P1 and P2 are connected to a power source $V_{DD}$. The gates of the P-channel transistors P1 and P2 are connected to each other. The drains of the P-channel transistors P1 and P2 are connected to the drains of N-channel transistors N1 and N2. A connection node n1 between the P-channel transistor P1 and the N-channel transistor N1 is connected to the gates of the P-channel transistors P1 and P2. A connection node n2 between the P-channel transistor P2 and the N-channel transistor N2 is connected to a CMOS output circuit OB constituted by a CMOS inverter circuit.

The gates of the N-channel transistors N1 and N2 are connected to input terminals In(+) and In(−). Where this sense amplifier is employed, for example, as an SRAM read-out circuit, the input terminals In(+) and In(−) are connected to bit lines BL and /BL. A connection node n3 between the N-channel transistors N1 and N2 is connected to the drain of an N-channel transistor N3. A signal $\phi$SE is supplied to the gate of the transistor N3 to render the sense amplifier active. The source of the transistor N3 is connected to the drain of an N-channel transistor N4. The source of the transistor N4 is grounded.

On the other hand, in the second comparator C2, the sources of P-channel transistors P3 and P4 are connected to power sources $V_{DD}$. The gates of the P-channel transistors P3 and P4 are connected to each other. The drains of the P-channel transistors P3 and P4 are connected to the drains of N-channel transistors N5 and N6. A connection node n4 between the P-channel transistor P3 and the N-channel transistor N5 is connected to the gates of the P-channel transistors P3 and P4. A connection node n5 between the P-channel transistor P4 and the N-channel transistor N6 is connected to a non-inversion input terminal of the comparator C3. The inversion input terminal of the comparator C3 is connected to a reference potential generating circuit Vp. The circuit Vp outputs a potential corresponding to a desirable output potential from the first comparator at the stand-by state, that is, a potential Vth.c+$\Delta$v0 obtained by adding a design margin $\neq$v0 to the threshold Vth.c of the CMOS output circuit OB.

Potentials Vin.0, which correspond to an input voltage of the first comparator C1 at the stand-by time, are supplied to the gates of the N-channel transistors N5 and N6. The sources of the N-channel transistors N5 and N6 are connected to the drain of an N-channel transistor N7. The gate of the transistor N7 is connected to a power source $V_{DD}$, and the source thereof is connected to the drain of an N-channel transistor N8. The source of the transistor N8 is grounded, and the gate thereof is connected to the gate of the N-channel transistor N4 and to the output terminal of the third comparator C3.

Figure 7:
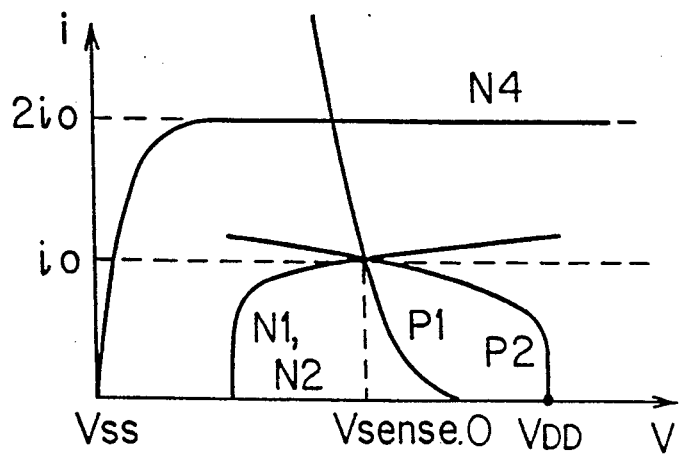
FIG. 7 shows a static characteristic of the comparator shown in FIG. 6.

FIG. 7 shows static characteristics of the first and third comparators C1 and C3. It is desirable that the first comparator C1 and the second comparator C2 have all the same circuit configuration and element dimensions, or the element dimensions of the second comparator C2 be smaller or greater than those of the first comparator C1.

When the gate potentials Vbias of the current control transistors N4 and N8 of the first and second comparators C1 and C2 increase, a DC bias current 2i0 of the transistor N4 increases and also currents i0 flowing to the transistors P1 and P2 increase. Thus, as shown in FIG. 7, the potential at the cross point between the current flowing through the transistors N1 and N2 and the current flowing through the transistors P1 and P2 decreases. Accordingly, an output potential Vsense.0 of the first and second comparators C1 and C2 at the standby time decreases. Inversely, when the gate potential Vbias of the transistors N4 and N8 lowers, the potential Vsense.0 rises.

Suppose that the output potential of the first comparator C1, that is, the output potential Vsense.0 of the second comparator C2 is higher than the reference potential Vth.c+$\Delta$v0. In this case, the output potential Vbias of the third comparator C3 increases, and the potential Vsense.0 decreases. Inversely, the output potential of the first comparator C1, that is, when the output potential Vsense.0 of the second comparator C2 is lower than the Vth.c+$\Delta$v0, the output potential Vbias of the third comparator C3 lowers and the output potential Vsense.0 rises. These potentials reach an equilibrium state when Vsense.0=Vth.c+$\Delta$v0. This can be said as far as the third comparator C3 functions ideally, not depending on the variance of the process, power source voltages or ambient temperature variance.

FIG. 8 shows a circuit for generating the reference potential Vth.c+$\Delta$v0. Like the CMOS output circuit OB, for example, this circuit is formed by short-circuiting the drains and gates of a P-channel transistor WP and an N-channel transistor WN having current paths connected in series. When the gate widths of the transistors WP and WN are equal to that of the CMOS output circuit OB or increased or decreased in proportion thereto, the generated potential is equal to Vth.c. Accordingly, when the gate widths are decreased, the consumed current decreases. If the element dimension ratio WP/WN of the transistors WP and WN is increased, compared to the CMOS output circuit OB, the generated potential is higher than the threshold Vth.c ($\Delta$v0>0). Inversely, if the element dimension ratio WP/WN is decreased, compared to the CMOS output circuit OB, the generated potential is lower than the threshold Vth.c ($\Delta$v0<0).

In this manner, a desired design margin ($\Delta$v0) can be easily set by adjustment of element dimensions (WP, WN). Since this circuit is identical to the CMOS output circuit OB, the characteristics of the former vary like those of the latter when a variance occurs in the manufacturing process, power source voltages or ambient temperatures. Thus, the generated potential Vth.c+$\Delta$v0 can compensate the above-mentioned variance, and the input stand-by output potential of the third comparator C3 can always be set near the threshold of the CMOS output circuit OB.

Figure 9:
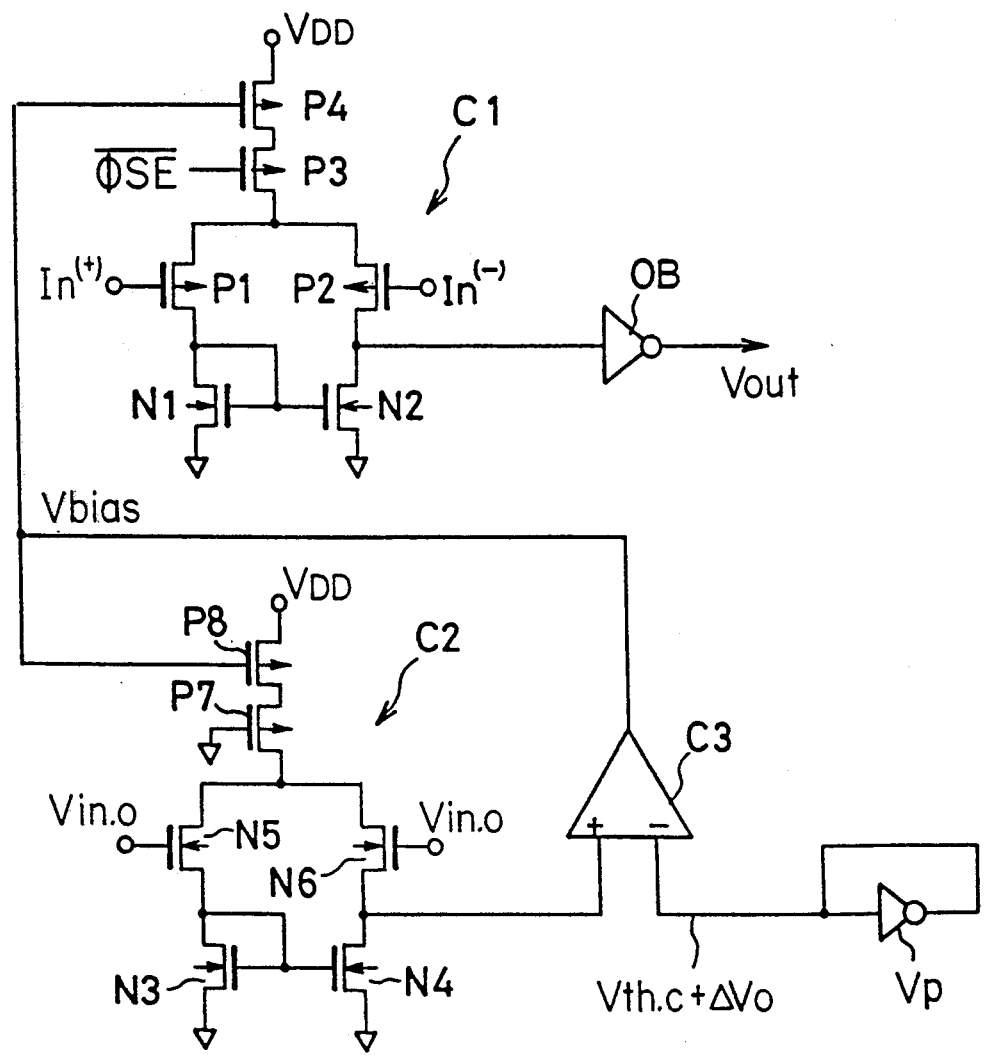
FIG. 9 is a circuit diagram showing a third embodiment of the invention, wherein the circuit of FIG. 6 is modified.

FIG. 9 shows a third embodiment of the present invention, wherein the conductivity types of the transistors in the circuit of FIG. 6 are modified. The basic function and effect of the circuit of FIG. 9 are identical to those of the circuit of FIG. 6.

Figure 10:
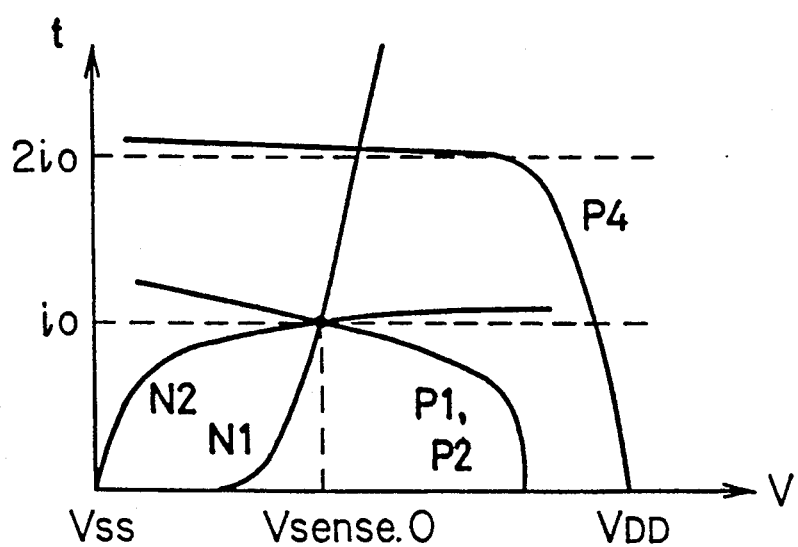
FIG. 10 shows a static characteristic of the comparator shown in FIG. 9.

FIG. 10 shows static characteristics of the comparators of the circuit of FIG. 9. As is clear from FIG. 10, when the gate potential (Vbias) of the current control P-channel transistors P4 and P8 of the first and second comparators C1 and C2 is increased and the bias current 2i0 of the comparators is decreased, the current 2i0 decreases accordingly and the output potential Vsense.0 of the second comparator C2 lowers. Inversely, when the gate potentials (Vbias) of the transistors P4 and P8 is decreased and the bias current 2i0 is increased, the output potential Vsense.0 of the second comparator C2 increases. Thus, in the circuit shown in FIG. 9, if the output potential of the first comparator C1, that is, the output potential Vsense.0 of the second comparator C2 is higher than Vth.c+Δv0, the output potential Vbias of the third comparator C3 rises. Accordingly, the bias current 2i0 decreases and the output potential Vsense.0 lowers. Inversely, when the output potential Vsense.0 is lower than Vth.c+Δv0, the output potential Vbias of the third comparator C3 lowers and the output potential Vsense.0 rises. In this way, the potentials reaches an equilibrium state when Vsense.0=Vth.c+Δv0.

FIG. 11 shows a fourth embodiment of the invention. In FIG. 11, the same elements as were shown in FIG. 6 are denoted by like reference numerals, and only different elements will be described.

The circuit of FIG. 11 differs from that of FIG. 6 with respect to the structure of the first comparator C1. Specifically, the first comparator C1 is constituted by arranging a pair of comparators C1a and C1b symmetrically. In the comparator C1b, the elements similar to those of the comparator C1a are accompanied with small letters. Complementary output terminals or connection nodes n1 and n2 between P-channel transistors P1 and P1a and N-channel transistors N1 and N1a are connected to a CMOS output circuit OB. More specifically, the connection nodes n1 and n1a are connected to one input terminal of a NAND circuit NA1 and one input terminal of a NAND circuit NA2 which constitute a flip-flop circuit FF. The output terminals of the NAND circuits NA1 and NA2 are connected to inverter circuits IV1 and IV2.

The basic operation of this circuit is similar to that of the circuit of FIG. 6. Specifically, when a signal φSE which renders the sense amplifier active is at the high level, the comparators C1a and C1b stand by for complementary input signals from the comparators C1a and C1b. In this state, the potential of nodes n1 and n1a is Vsense.0=Vth.c+Δv0 (Δv0>0). In other words, in the state wherein a potential vin(+)=Vin(−)=Vin.0 is input to the complementary signal input terminals In(+) and In(−), the output voltages of the comparators C1a and C1b are designed to be higher than the threshold Vth.c of the CMOS output circuit OB by a design margin Δv0. When the complementary signals are input, the potential of either node n1 or node n1a exceeds Vth.c, and the output potential of the CMOS output circuit OB is inverted. Thereafter, when the complementary input signals are set in the stand-by state once again, the potentials of nodes n1 and n1a is restored to Vsense.0, and the output potential is held by the flip-flop FF.

In this embodiment, too, the sense amplifier capable of performing a high-speed operation can be obtained.

In the third embodiment, it is possible to constitute the second comparator C2 by a pair of comparators, like the first comparator C1, and to short-circuit an output terminal of one of the comparators or output terminals of both comparators and connect this or these output terminals to the non-inversion input terminal of the third comparator C3.

The threshold of the CMOS output circuit OB is set by the flip-flop circuit FF. Instead, it is possible to employ a circuit in which two input terminals and an output terminal of a two-input NAND circuit are short-circuited, or a circuit in which two input terminals and two output terminals of one flip-flop circuit FF are short-circuited.

FIG. 12 shows results of simulation by use of the SPICE, with respect to the characteristics of the circuit (A) of the present invention shown in FIG. 11 and the conventional circuit (B) which does not include the second and third comparators C2 and C3. From FIG. 12 the following advantages of the present invention can be confirmed. The characteristics of these circuits (A) and (B) were obtained by simulation by varying the process and power source voltages.

(1) In the conventional circuit (B), owing to the variance in the process or a slight fluctuation of power source voltages, the output potential Vsense.0 of the comparators and the threshold Vth.c of the CMOS output circuit are considerably varied. Thus, a margin for noise is not provided, and a variance in total delay time tpd required for signal propagation is large. However, in the circuit (A) of the present invention, such variances are always compensated, and the difference between the output potential Vsense.0 and the threshold Vth.c is automatically adjusted so as to be substantially constant. As a result, a variance in total delay time tpd is small, and a constant noise margin is maintained.

(2) In the conventional circuit (B), the output Vsense.0 of the comparator and the threshold Vth.c of the CMOS output circuit are designed to be substantially equal by adjusting the element dimensions individually. Since an error is present between the design values and actual values, a margin is added, taking the error into account. Thus, there is a limit in equalizing Vsense.0 to vth.c, and it is difficult to increase the circuit operation speed. By contrast, in the circuit (A) of the present invention, if the element dimensions are designed correctly to some extent, Vsense.0 and Vth.c are equalized by automatic control. Therefore, there is no limit in design, unlike the conventional circuit, and the circuit operation speed can be increased.

In the case of the circuit (A) of the present invention, the dimensions of the elements of the reference potential generating circuit are altered in accordance with the dimensions of the elements of the CMOS output circuit, so that a noise margin can be freely added. Thus, designing is facilitated, an excess design margin is not needed, and the time for designing can be shortened.

(3) By virtue of the above advantages (1) and (2), the operation speed of the circuit (A) can be made higher than that of the conventional circuit (B), and the variance in the manufacturing process or in power source voltage can automatically be compensated.

FIG. 13 shows a fifth embodiment of the present invention. In FIG. 13, the same elements as are shown in FIG. 6 are denoted by like reference numerals, and only different elements will be described.

In this embodiment, the gate of a P-channel transistor P1 of the first comparator C1 is connected to the drain of a P-channel transistor P2. The gate of the P-channel transistor P2 is connected to the drain of the P-channel transistor P1. The gate of a P-channel transistor P3 of the second comparator C2 is connected to the drain of a P-channel transistor P4. The gate of the transistor P4 is connected to the drain of the transistor P3. Nodes n1 and n2 of the first comparator C1 are connected to the CMOS output circuit OB. Specifically, the nodes n1 and n2 are connected to the gates of N-channel transistors N9 and N10 via inverter circuits IV3 and IV4. The current paths of the transistors N9 and N10 are connected in series. The connection node between the transistors N9 and N10 is connected to an output terminal Vout. This fifth embodiment can bring about the same effects as in the first to third embodiments.

It is necessary that the polarities of the two input terminals of the third comparator C3 be determined so as to provide a negative feedback in a closed loop formed by the second comparator C2 and the third comparator C3. Specifically, in the case where the stand-by time output potentials of the first and second comparators C1 and C2 increase when the output potential of the third comparator C3 increases and where the stand-by time output potentials decrease when the output potential of the third comparator C3 decreases, the following means must be provided. That is, the output of the second comparator C2 is connected to the inversion input terminal of the third comparator C3 and the output of the reference potential generating circuit Vp is connected to the non-inversion input terminal of the third comparator C3. On the other hand, in the case where the stand-by time output potentials decrease when the output potential of the third comparator C3 decreases and where the stand-by time output potentials increase when the output potential of the third comparator C3 decreases, the following means must be provided. That is, the output of the second comparator C2 is connected to the non-inversion input terminal of the third comparator C3 and the output of the reference potential generating circuit Vp is connected to the inversion input terminal of the third comparator C3.

Specifically, where the first and second comparators C1 and C2 are constructed, as shown in FIGS. 14A to 14E, the polarity of the second comparator C2 and that of the reference voltage generating circuit Vp, which are both connected to the input terminals of the third comparator C3, are as follows:

In the case of FIG. 14A: $C2 = "+"$, $Vp = "-"$,
In the case of FIG. 14B: $C2 = "+"$, $Vp = "-"$,
In the case of FIG. 14C: $C2 = "+"$, $Vp = "-"$,
In the case of FIG. 14D: $C2 = "-"$, $Vp = "+"$,
In the case of FIG. 14E: $C2 = "-"$, $Vp = "+"$.

FIG. 15 shows a sixth embodiment of the present invention, wherein a current bias circuit CB is added to the circuit of FIG. 6. The same elements as are shown in FIG. 6 are denoted by like reference numerals. The current bias circuit CB keeps constant the bias currents to the first and second comparators C1 and C2 in accordance with the output potential of the third comparator C3.

The source of a P-channel transistor P11 is connected to a power source $V_{DD}$, and the gate thereof is supplied with a constant voltage V0. The drain of the transistor P11 is connected to the drain of an N-channel transistor N11. The gate of the transistor N11 is connected to the output terminal of the third comparator C3, and the source thereof is connected to the drain and the gate of an N-channel transistor N12. The gate of the transistor N12 is connected to the gates of transistors N4 and N8, and the source thereof is connected to a power source Vss.

This sixth embodiment is effective when the output potential Vsense.0 of the first and second comparators C1 and C2 cannot be controlled within the dynamic range of the output potential of the third comparator C3.

FIGS. 16A to 16C show other embodiments of the current bias circuit CB.

In the embodiment of FIG. 16A, the N-channel transistor N11 of the current bias circuit CB of FIG. 15 is replaced by a P-channel transistor P12.

In the embodiment of FIG. 16B, the conductivity types of the transistors in the current bias circuit CB shown in FIG. 15 are reversed. Specifically, the source of a P-channel transistor P13 is connected to a power source $V_{DD}$. The gate of the transistor P13 is connected to the gates of the transistors N4 and N8 and to the drain of the transistor P13. The drain of the transistor P13 is connected to the drain of an N-channel transistor N13. The gate of the transistor N13 is connected to an output terminal of the third comparator C3, and the source thereof is connected to the drain of an N-channel transistor N14. The gate of the transistor N14 is supplied with a constant voltage V0, and the source thereof is connected to a ground Vss.

In the embodiment of FIG. 16C, the N-channel transistor N13 of the current bias circuit CB of FIG. 16B is replaced by a P-channel transistor P14.

Figure 17:
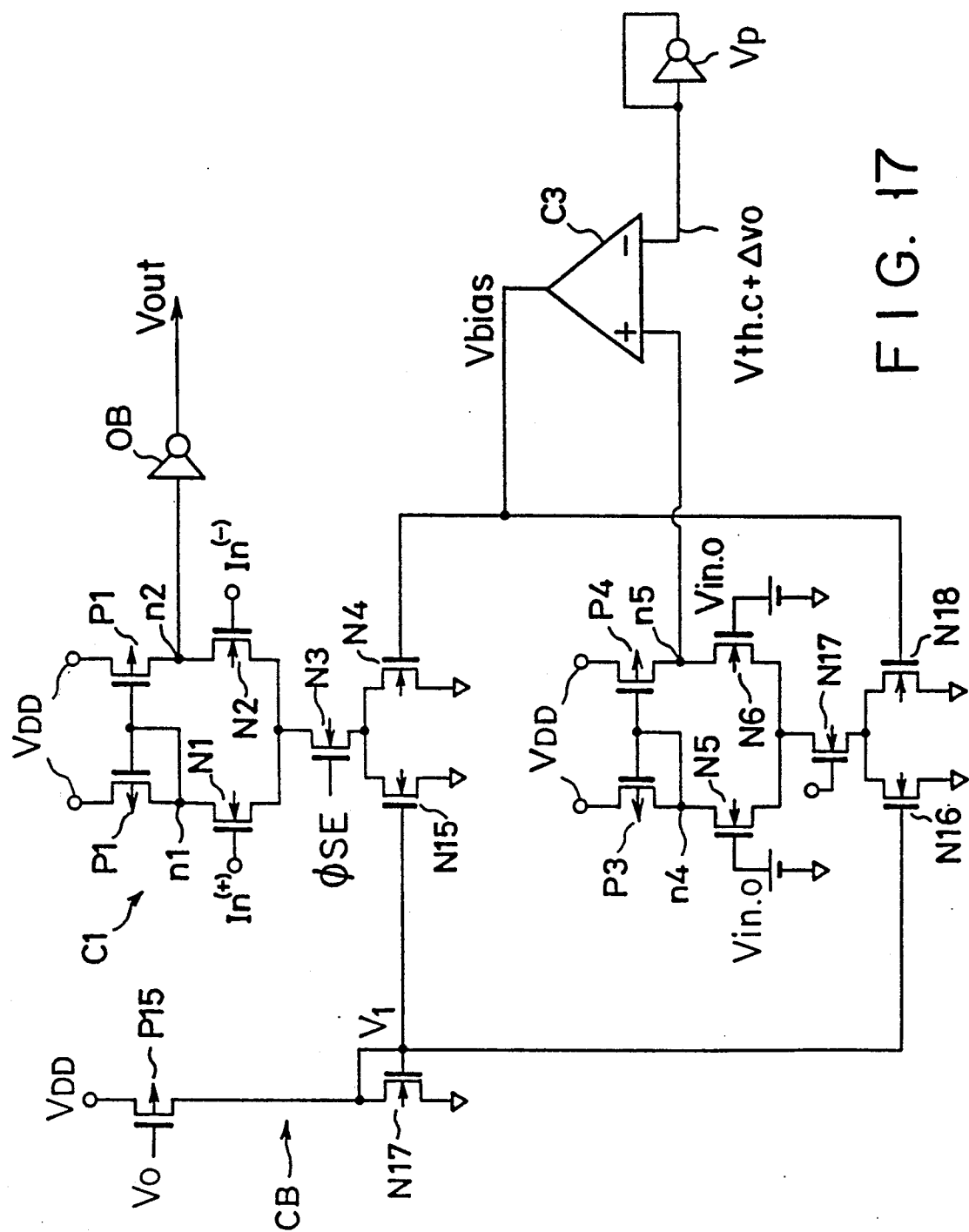
FIG. 17 is a circuit diagram showing a seventh embodiment of the invention, wherein the circuit of FIG. 6 is modified.

FIG. 17 shows a seventh embodiment of the present invention, wherein the circuit of FIG. 6 is modified. Specifically, bias currents to the first and second comparators C1 and C2 are controlled by an output voltage of the current bias circuit CB and an output voltage Vbias of the third comparator C3. A transistor N4 of the first comparator C1 is connected in parallel to an N-channel transistor N15, and a transistor N8 of the second comparator C2 is connected in parallel to an N-channel transistor N16. The transistors N15 and N16 are controlled by the current bias circuit CB. In the current bias circuit CB, the source of a P-channel transistor P15 is connected to a power source $V_{DD}$, the gate thereof is supplied with a constant voltage V0, and the source thereof is connected to the drain and gate of an N-channel transistor N17. The gate of the transistor N17 is connected to the gates of transistors N15 and N16, and the source thereof is connected to a power source Vss.

In the second to sixth embodiments, the transistors N3 and N7 are connected to the power source $V_{DD}$ side with respect to the transistor N4 (N15) or N8 (N16); however, it is possible to connect the transistor N4 (N15) or N8 (N16) on the power source $V_{DD}$ side with respect to the transistors N3 and N7.

In addition, when a signal &U SE is input to the transistor N3 (N3a) or P3, it is possible to supply a potential Vbias or V1 to the transistors N4 and N8 (N15 and N16) or transistors P4 and P8. When a signal/$\phi$SE is input to the transistor N3 (N3a) or P3, it is possible to supply the transistors N4 and N8 (N15 and N16) or transistors P4 and P8 at gates with one of potentials Vss and $V_{DD}$ which render the comparator inactive. It is also possible to always activate the comparator without using the signal $\phi$SE.

FIG. 18 shows an eighth embodiment of the invention. In the first to sixth embodiments, the bias currents to the first and second comparators C1 and C2 are controlled by the output potential of the third comparator C3. In other words, the third comparator C3 performs a feed-back control so as to set the stand-by time output potential (Vsense.0) of the first comparator C1 at a potential (Vsense.0=Vthc+$\Delta$v0) which is obtained by adding a design margin ($\Delta$v0) for noise to the threshold (Vthc) of the CMOS output circuit OB.

On the other hand, in the eighth embodiment of FIG. 18, the bias currents to the CMOS output circuit OB and the reference potential generating circuit Vp are controlled by the output potential of the third comparator C3. Specifically, the potential Vthc+$\Delta$v0 is controlled by the output potential of the third comparator C3 so as to be coincide with Vsense.0.

In the eighth embodiment of FIG. 18, the invention is applied to the input circuit of FIG. 1. The source of a P-channel transistor P20, which is an element of a reference potential generating circuit Vp, is connected to a power source $V_{DD}$, and the drain of the transistor P20 is connected to the drain of an N-channel transistor N20. The drains of these transistors P20 and N20 are connected to their gates and to a non-inversion input terminal of the third comparator C3. The source of the transistor N20 is connected to the drain of an N-channel transistor N21. The gate of the transistor N21 is connected to the output terminal of the third comparator C3, and the source thereof is connected to a power source Vss (ground potential).

On the other hand, the source of a P-channel transistor P21, which is an element of an inverter circuit 27 of a CMOS output circuit OB, is connected to a power source $V_{DD}$. The drain of the transistor P21 is connected to the drain of an N-channel transistor N22. The gates of these transistors P21 and N22 are connected to an output terminal of the first comparator C1, and the drains thereof are connected to an inverter circuit 28. The source of the transistor N22 is connected to the drain of an N-channel transistor N23. The gate of the transistor N23 is connected to the output terminal of the third comparator C3, and the source thereof is connected to a power source Vss (ground potential).

The gate of a transistor 33, which is an element of the second comparator C2, is connected to a bias circuit. Specifically, the gate of the transistor 33 is connected to the gate of a P-channel transistor P31. The source of the transistor P31 is connected to a power source $V_{DD}$. The drain of the transistor P31 is connected to the gate thereof and to one end of a resistor R1. The other end of the resistor R1 is connected to the drain of an N-channel transistor N31. The gate of the transistor N31 is connected to a constant bias power source (not shown), and the source of the transistor N31 is connected to a power source Vss (ground potential).

This embodiment, too, can realize a high-speed operation, without influence due to variances in the manufacturing process or power source voltages.

FIG. 19 shows a ninth embodiment of the invention, wherein bias currents to the CMOS output circuit OB and reference voltage generating circuit Vp are controlled by the output potential of the third comparator C3 of the sense amplifier shown in FIG. 6. The same elements as are shown in FIG. 6 and FIG. 18 are denoted by like reference numerals, and description thereof is omitted.

FIG. 20 shows a tenth embodiment of the invention, wherein the invention is applied to an address transition detector.

The address transition detector comprises an edge detection circuit EG for detecting edges of address signals AD and /AD, a first sense amplifier SA1 for amplifying an output signal from the edge detection circuit EG, a CMOS output circuit OB for outputting an output signal from the first sense amplifier, a second sense amplifier SA2 having the same structure as the first sense amplifier SA1, a comparator C3 for controlling bias currents to the first and second sense amplifiers SA1 and SA2, and a reference potential generating circuit Vp for supplying a reference potential to the comparator C3.

In the edge detection circuit EG, an address signal AD is supplied to the gate of an N-channel transistor N51. The current path of an N-channel transistor N52 is connected in series to the transistor N51. The gate of the transistor N52 is supplied with an address signal AD which is inverted by an inverter circuit IV1. An address signal /AD is supplied to the gate of an N-channel transistor N53. The current path of an N-channel transistor N54 is connected in series to the transistor N53. The gate of the transistor N54 is supplied with an address signal /AD which is inverted by an inverter circuit IV2. The series-connected transistors N51 and N52 and the series-connected transistors N53 and N54 are connected in parallel. The sources of the transistors N52 and N54 are grounded via an N-channel transistor N55. The gate of the transistor N55 is supplied with a predetermined potential VG.

In the first sense amplifier SA1, the base of an NPN transistor Q51 is connected to a power source $V_{DD}$ via a resistor R51 and is grounded via an N-channel transistor N56. The collector of the transistor Q51 is connected to a power source $V_{DD}$, and the emitter of the transistor Q51 is grounded via an N-channel transistor N57 and is connected to the base of an NPN transistor Q52. The emitter of the transistor Q52 is connected to the drains of the transistors N51 and N53 and is grounded via an N-channel transistor N58. The collector of the transistor Q52 is connected to a power source $V_{DD}$ via a resistor R52 and to the base of an NPN transistor Q53. The collector of the transistor Q53 is connected to a power source $V_{DD}$, and the emitter thereof is grounded via an N-channel transistor N59 and is connected to the CMOS output circuit OB. The gates of the transistors N56 to N59 are supplied with a predetermined voltage VG.

The second sense amplifier SA2 has the same structure as the first sense amplifier SA1; thus, the common elements with the amplifier SA1 are denoted by adding a letter "a" to the numerals. In the second sense amplifier SA2, the emitter of a transistor Q53a is connected to a non-inversion input terminal of the comparator C3. The output terminal of the comparator C3 is connected to the gates of transistors N58 and N58a of the first and second sense amplifiers SA1 and SA2.

The input of the second sense amplifier SA2 is set in the input stand-by state of the first sense amplifier, that is, in a high impedance state. The reference potential generating circuit Vp generates a potential (Vsense.0=Vthc+$\Delta$v0) obtained by adding a design margin ($\Delta$v0) for noise to the threshold (Vthc) of the CMOS output circuit OB.

In the above structure, when the output potential Vbias of the comparator C3 increases, the output potential Vsense.0 of the first and second sense amplifiers SA1 and SA2 at the stand-by time decreases. Inversely, when the output potential Vbias of the comparator C3 decreases, the output potential Vsense.0 of the first and second sense amplifiers SA1 and SA2 increases.

Now suppose that the output potential of the first sense amplifier SA1, that is, the output potential Vsense.0 of the second sense amplifier SA2 is higher than the reference potential Vth.c+$\Delta$v0. In this case, the output potential Vbias of the comparator C3 increases and Vsense.0 decreases. Inversely, the output potential of the first sense amplifier SA1, that is, the output potential Vsense.0 of the second sense amplifier SA2 is lower than Vth.c+$\Delta$v0, the output potential Vbias of the comparator C3 decreases and Vsense.0 increases. In this way, when Vsense.0=Vth.c+$\Delta$v0, these potentials reach an equilibrium. This can always be said as far as the comparator C3 operates ideally, without influence due to variances in the manufacturing process, power source voltages and ambient temperatures.

FIG. 21 shows an eleventh embodiment of the invention, wherein the transistors N58 and N58a shown in FIG. 20 are controlled by means of the current bias circuit CB controlled by the output from the comparator C3. The same elements as are shown in FIG. 20 are denoted by like reference numerals, and description thereof is omitted. The 11th embodiment is effective when the first and second sense amplifiers SA1 and SA2 cannot be controlled within the dynamic range of the third comparator C3.

Figure 22:
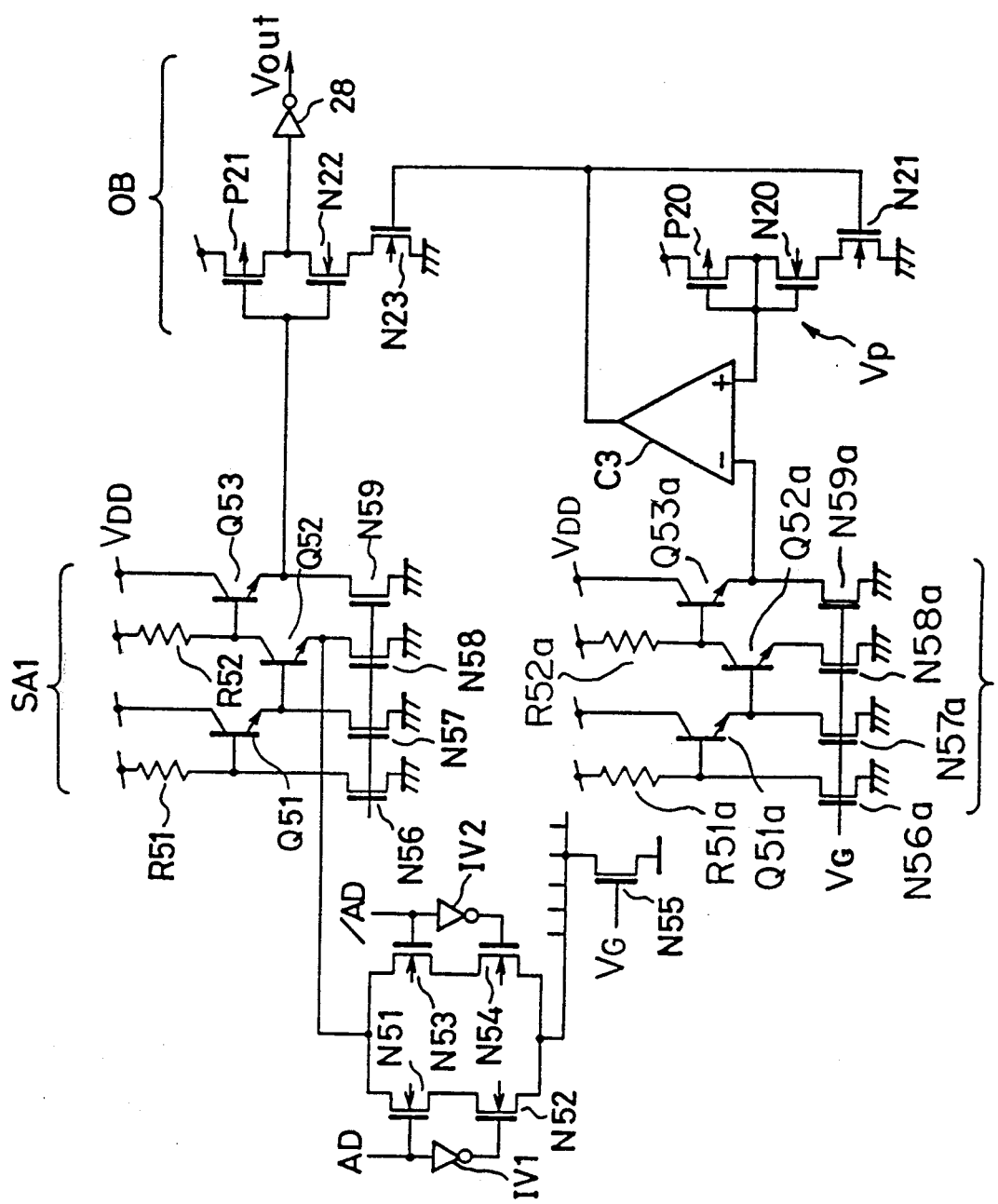
FIG. 22 is a circuit diagram showing a twelfth embodiment of the invention, wherein the circuit of FIG. 20 is modified.

FIG. 22 shows a twelfth embodiment of the invention, wherein bias currents to the CMOS output circuit OB and the reference voltage generating circuit Vp are controlled by the output from the comparator C3. The elements common to those shown in FIGS. 19 and 20 are denoted by like reference numerals.

Regarding the circuit shown in FIG. 22, suppose that the output potential of the first sense amplifier SA1, that is, the output potential Vsense.0 of the second sense amplifier SA2 is higher than the reference potential Vth.c+$\Delta$v0. In this case, the output potential Vbias of the comparator C3 decreases and the reference potential Vth.c+$\Delta$v0 increases. Inversely, when the output potential of the first sense amplifier SA1, that is, the output potential Vsense.0 of the second sense amplifier SA2 is lower than the reference potential Vth.c+$\Delta$v0, the output potential Vbias of the comparator C3 increases and the reference potential Vth.c+$\Delta$v0 decreases. In this manner, when Vsense.0=Vth.c+$\Delta$v0, these potentials reach an equilibrium. This can always be said as far as the comparator C3 operates ideally, without influence due to variances in the manufacturing process, power source voltages and ambient temperatures.

Figure 23:
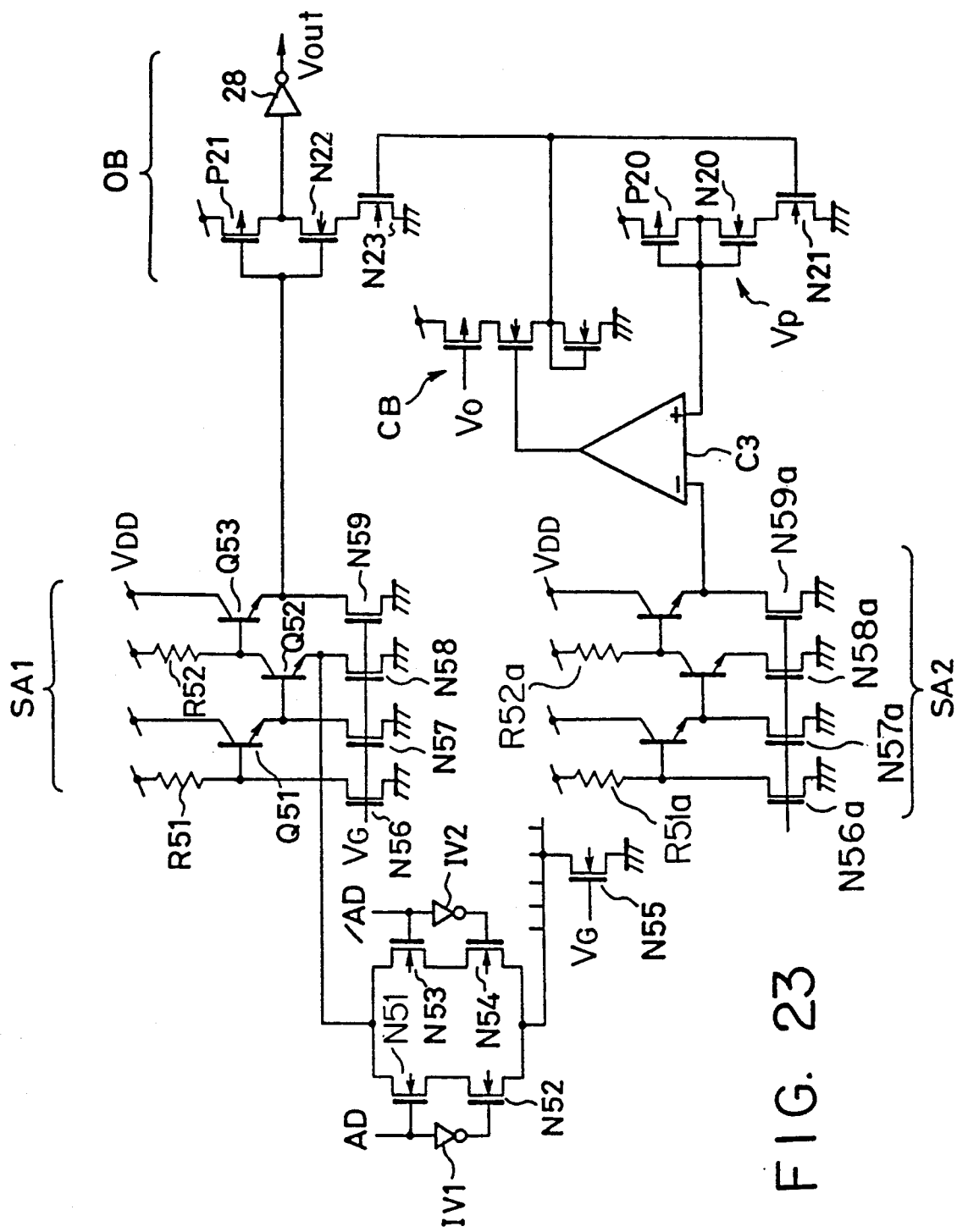
FIG. 23 is a circuit diagram showing a thirteenth embodiment of the invention, wherein the circuit of FIG. 20 is modified.
Figure 25A:
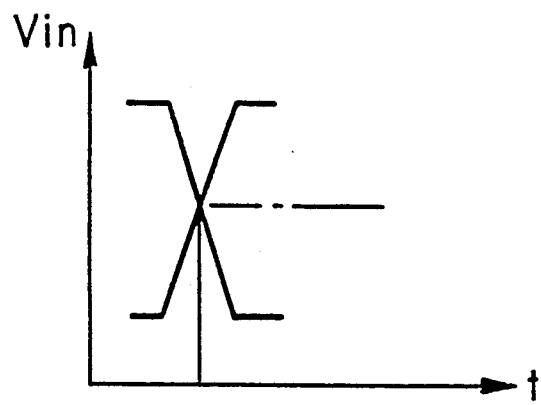
FIGS. 25A to 25C are characteristic diagrams for explaining the operation of the circuit of FIG. 24.
Figure 25B:
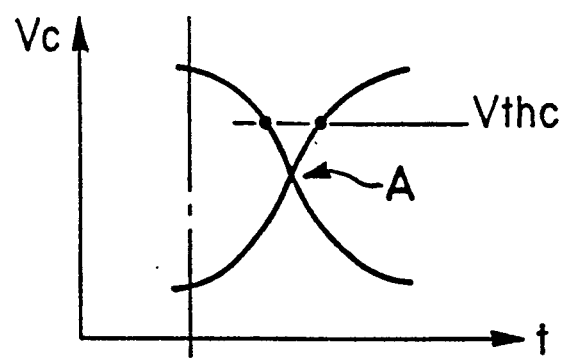
Figure 25C:
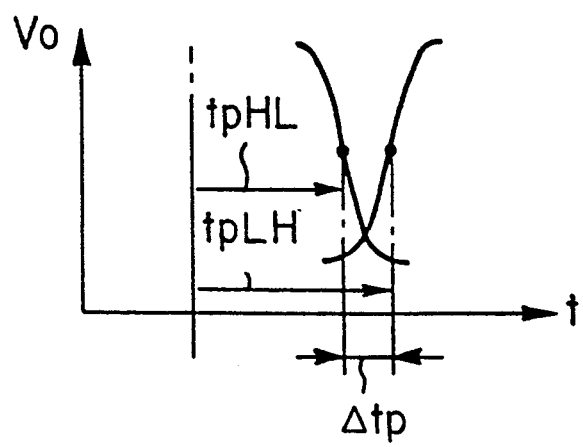

FIG. 23 shows a thirteenth embodiment of the invention, wherein the tenth and eleventh embodiments are combined. The elements common to those shown in FIGS. 21 and 22 are denoted by like reference numerals and description thereof is omitted. In this thirteenth embodiment, the current bias circuit CB is controlled by the output potential of the third comparator C3. The N-channel transistor of the CMOS output circuit OB and the N-channel transistor of the reference potential generating circuit Vp are controlled by the output from the current bias circuit CB.

The present invention is not limited to the above embodiments, and various changes and modifications can be made within the spirit of the present invention.

What is claimed is:

1. A semiconductor integrated circuit comprising:
  a comparator having a first input terminal, a second input terminal and a current source circuit, said comparator outputting a difference voltage between a first input voltage supplied to the first input terminal and a second input voltage supplied to the second input terminal;
  an output circuit to which the output voltage from the comparator is supplied, said output circuit being constituted by a circuit element having a threshold voltage;
  a voltage generating circuit for generating a voltage equal to the threshold voltage of the output circuit, a circuit element constituting the voltage generating circuit having substantially the same dimension ratio as the circuit element of the output circuit; and
  a correction circuit for controlling a current amount of the current source circuit in accordance with the voltage generated by the voltage generating circuit, and correcting the output voltage from the comparator so that the output voltage from the comparator is substantially equal to the threshold voltage of the output voltage when the first input voltage supplied to the first input terminal is equal to the second input voltage supplied to the second input terminal.

2. A circuit according to claim 1, wherein said output circuit is a CMOS inverter circuit.

3. A circuit according to claim 1, wherein said voltage generating circuit generates a voltage with a value obtained by adding a design margin to the threshold voltage of the output circuit.

4. A circuit according to claim 1, wherein said voltage generating circuit is a CMOS inverter circuit having an input terminal and an output terminal which are connected to each other.

5. A semiconductor integrated circuit comprising:
  a first comparator having a first input terminal, a second input terminal and a current source circuit, said first comparator outputting a difference voltage between an input voltage supplied to the first input terminal and a reference voltage supplied to the second input terminal;
  an output circuit to which the output voltage from the first comparator is supplied, said output circuit being constituted by a circuit element having a threshold voltage;
  a second comparator having a first input terminal, a second input terminal and a current source circuit, said first and second input terminals being supplied with the reference voltage, and said second comparator outputting a difference voltage between the reference voltage supplied to the first input terminal and the reference voltage supplied to the second input terminal;
  a voltage generating circuit for generating a voltage equal to the threshold voltage of the output circuit, a circuit element constituting the voltage generating circuit having substantially the same dimension ratio as the circuit element of the output circuit; and
  a third comparator, having a first input terminal and a second input terminal, for controlling the amount of a current to each of the current source circuits of the first and second comparators in accordance with the difference voltage between the voltage supplied to the first input terminal from the voltage generating circuit and the voltage supplied to the second input terminal from the second comparator.

6. A circuit according to claim 5, wherein said output circuit is a CMOS inverter circuit.

7. A circuit according to claim 5, wherein said voltage generating circuit generates a voltage with a value obtained by adding a design margin to the threshold voltage of the output circuit.

8. A semiconductor integrated circuit comprising:
  a first comparator having a first input terminal, a second input terminal and a current source circuit, said first comparator outputting a difference voltage between complementary voltages with opposite potentials supplied to the first and second input terminals;
  an output circuit to which the output voltage from the first comparator is supplied, said output circuit being constituted by a circuit element having a threshold voltage;

a second comparator having a first input terminal, a second input terminal and a current source circuit, said first and second input terminals being supplied with voltages equal to the output voltage from the first comparator and a stand-by time, and said second comparator outputting difference voltages between these voltages;

a voltage generating circuit for generating a voltage equal to the value obtained by adding a design margin to the threshold voltage of the output circuit, a circuit element constituting the voltage generating circuit having substantially the same dimension ratio as the circuit element of the output circuit; and a third comparator, having a first input terminal and a second input terminal, for controlling the amount of a current to each of the current source circuits of the first and second comparators in accordance with the difference voltage between the voltage supplied to the first input terminal from the voltage generating circuit and the voltage supplied to the second input terminal from the second comparator.

9. A circuit according to claim 8, wherein said complementary voltages are bit line potentials.

10. A circuit according to claim 8, wherein said output circuit is a CMOS inverter circuit.

11. A circuit according to claim 8, wherein said voltage generating circuit generates a voltage with a value obtained by adding a design margin to the threshold voltage of the output circuit.

12. A circuit according to claim 8, wherein the first input terminal of the third comparator is an inversion input terminal and the second input terminal is a non-inversion input terminal.

13. A circuit according to claim 12, wherein in the case where when the output potential of the third comparator increases, stand-by time output potentials of the first and second comparators increase and in the case where when the output potential of the third comparator decreases, the stand-by time output potentials of the first and second comparators decrease, the output voltage of the second comparator is supplied to the inversion input terminal of the third comparator and the output voltage of the reference voltage generating circuit is supplied to the non-inversion input terminal of the third comparator.

14. A circuit according to claim 12, wherein the case where when the output potential of the third comparator increases, stand-by time output potentials of the first and second comparators decrease and in the case where when the output potential of the third comparator decreases, the stand-by time output potentials of the first and second comparators increase, the output voltage of the second comparator is supplied to the non-inversion input terminal of the third comparator and the output voltage of the reference voltage generating circuit is supplied to the inversion input terminal of the third comparator.

15. A circuit according to claim 8, further comprising a bias circuit for generating potentials for controlling the amounts of currents flowing to each of the current source circuits of the first and second comparators, the potential generated by the bias circuit being controlled by the output voltage of the third comparator.

16. A circuit according to claim 8, wherein said current source circuit of the first comparator is constituted by first and second insulated gate transistors with gates, said current source circuit of the second comparator is constituted by first and second insulated gate transistors with gates, said first insulated gate transistors are controlled by the output voltage of the third comparator, and said second insulated gate transistors are controlled by a bias circuit for generating a predetermined potential.

17. A circuit according to claim 8, wherein said reference potential generating circuit includes a first P-channel transistor, a first N-channel transistor and a second N-channel transistor, the drain of the first P-channel transistor is connected to the gate of the first P-channel transistor and to the drain and gate of the first N-channel transistor, the source of the first N-channel transistor is connected to the drain of the second N-channel transistor, and the gate of the second N-channel transistor is connected to the output terminal of the third comparator.

18. A circuit according to claim 8, wherein said output circuit includes a first P-channel transistor, a first N-channel transistor and a second N-channel transistor, the gate of the first P-channel transistor is connected to the gate of the first N-channel transistor, the drain of the first P-channel transistor is connected to the drain of the first N-channel transistor, the source of the first N-channel transistor is connected to the drain of the second N-channel transistor, and the gate of the second N-channel transistor is connected to the output terminal of the third comparator.

19. A semiconductor integrated circuit comprising:
a first comparator having a first input terminal, a second input terminal and a current source circuit, said first comparator outputting a difference voltage between complementary voltages with opposite potentials supplied to the first and second input terminals;

a second comparator having a first input terminal, a second input terminal and a current source circuit, said second comparator outputting a difference voltage between complementary voltages with opposite potentials supplied to the first and second input terminals;

an output circuit supplied with the output voltages from the first and second comparators, said output circuit being constituted by a circuit element having a threshold voltage;

a third comparator having a first input terminal, a second input terminal and a current source circuit, said first and second input terminals being supplied with voltages with values equal to stand-by state output voltages of the first and second comparators, and said third comparator outputting a difference voltage between the supplied voltages;

a voltage generating circuit for generating a voltage with a value obtained by adding a design value to the threshold voltage of the output circuit, a circuit element, which constitutes the voltage generating circuit, having substantially the same dimension ratio as the circuit element of the output circuit; and a fourth comparator, having a first input terminal and a second input terminal, for controlling the amount of a current to each of the current source circuits of the first, second, and third comparators in accordance with the difference voltage between the voltage supplied to the first input terminal from the voltage generating circuit and the voltage supplied to the second input terminal from the third comparator.

20. A circuit according to claim 19, wherein said complementary voltages are bit line potentials.

21. A circuit according to claim 19, wherein said output circuit comprises a flip-flop circuit for holding output voltages from the first and second comparators, a first CMOS inverter circuit for inverting a first output voltage output from the flip-flop circuit, and a second CMOS inverter circuit for inverting a second output voltage output from the flip-flop circuit.

22. A semiconductor integrated circuit comprising:
an edge detection circuit for detecting an edge of an address signal;
a first amplifier having an input terminal, an output terminal and a current source circuit, said first amplifier amplifying an output signal from the edge detection circuit supplied to said input terminal and outputting the amplified signal from said output terminal;
an output circuit connected to the output terminal of the first amplifier and constituted by an inverter circuit;
a voltage generating circuit having substantially the same dimension ratio as said output circuit and generating a voltage with a value obtained by adding a design value to a threshold voltage of the output circuit;
a second amplifier having an output terminal and a current source circuit, said second amplifier outputting from said output terminal a voltage equal to the voltage output from the output terminal of the first amplifier at a stand-by time at which no signals are supplied from the edge detection circuit to the first amplifier; and
a comparator for controlling the amount of a current to each of the current source circuits of the first and second amplifiers in accordance with a difference voltage between the output voltage from the second amplifier and the voltage generated by the voltage generating circuit.

23. A circuit according to claim 22, wherein said output circuit is a CMOS inverter circuit.

24. A circuit according to claim 22, wherein said voltage generating circuit generates a voltage with a value obtained by adding a design margin to the threshold voltage of the output circuit.

* * * * *